(12) United States Patent
Noda et al.

(10) Patent No.: US 6,473,358 B2
(45) Date of Patent: Oct. 29, 2002

(54) SEMICONDUCTOR MEMORY DEVICE

(75) Inventors: Hiromasa Noda, Hamura; Youji Idei, Asaka; Osamu Nagashima; Tetsuo Ado, both of Hamura, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/097,564

(22) Filed: Mar. 15, 2002

(65) Prior Publication Data

US 2002/0093870 A1 Jul. 18, 2002

Related U.S. Application Data

(63) Continuation of application No. 09/789,753, filed on Feb. 22, 2001, now Pat. No. 6,385,100.

(30) Foreign Application Priority Data

Feb. 24, 2000 (JP) ........................................ 2000-046889

(51) Int. Cl.[7] ................................................. G11C 8/00
(52) U.S. Cl. ........................... 365/230.06; 365/189.07; 365/189.12; 365/230.04
(58) Field of Search ....................... 365/230.06, 189.12, 365/189.07, 230.04

(56) References Cited

U.S. PATENT DOCUMENTS

| | | | | |
|---|---|---|---|---|
| 5,572,463 A | * | 11/1996 | Akaogi et al. ......... | 365/185.01 |
| 5,805,504 A | | 9/1998 | Fujita ..................... | 365/189.05 |
| 5,852,585 A | * | 12/1998 | Koshizuka ............. | 365/230.08 |
| 6,009,038 A | * | 12/1999 | Koshizuka ............. | 365/230.06 |
| 6,011,751 A | * | 1/2000 | Hirabayashi ........... | 365/230.02 |
| 6,088,291 A | * | 7/2000 | Fujioka et al. ......... | 365/230.08 |
| 6,240,048 B1 | | 5/2001 | Matsubara .................. | 365/233 |
| 6,335,901 B1 | * | 1/2002 | Morita et al. ................ | 365/194 |

FOREIGN PATENT DOCUMENTS

| | | |
|---|---|---|
| JP | 6-275073 | 9/1994 |
| JP | 9-320269 | 12/1997 |

* cited by examiner

*Primary Examiner*—Richard Elms
*Assistant Examiner*—Tuan T. Nguyen
(74) *Attorney, Agent, or Firm*—Antonelli, Terry, Stout & Kraus, LLP

(57) ABSTRACT

A semiconductor memory device has a column address decoder which includes first and second pre-decoders corresponding to high-order and low-order addresses, respectively, a shift register for using the output signal of the second pre-decoder as an initial value, and an output circuit for selecting either the output signal of the second pre-decoder or the output signal of the shift register in accordance with an action mode. The select signal is formed by the output signal of the first pre-decoder and the output signal through the output circuit. The shift register includes a first shift register for an even address and a second shift register for an odd address and forms two sets of continuous select signals of the bit lines, as composed of a sequential action and an interleave action, on the basis of the initial value by combining its up and down shifting actions.

3 Claims, 18 Drawing Sheets

FIG. 6

| BURST LENGTH | START ADDRESS (A2, A1, A0) | SEQUENTIAL ACTION MODE | INTERLEAVE ACTION MODE | COUNT DIRECTION OF (A2, A1) IN BURST SEQUENCE IN SEQUENTIAL ACTION | | COUNT DIRECTION OF (A2, A1) IN BURST ACTION IN INTERLEAVE MODE | SHIFT NUMBER OF SHIFT REGISTER |
|---|---|---|---|---|---|---|---|
| | | | | EVEN | ODD | | |
| 2 | xx0 | 0,1 | 0,1 | — | — | — | 0 |
| | xx1 | 1,0 | 1,0 | — | — | — | 0 |
| 4 | x00 | 0,1,2,3 | 0,1,2,3 | up | up | up | 1 |
| | x01 | 1,2,3,0 | 1,0,3,2 | down | up | up | 1 |
| | x10 | 2,3,0,1 | 2,3,0,1 | down | down | down | 1 |
| | x11 | 3,0,1,2 | 3,2,1,0 | up | down | down | 1 |
| 8 | 000 | 0,1,2,3,4,5,6,7 | 0,1,2,3,4,5,6,7 | up | up | up | 3 |
| | 001 | 1,2,3,4,5,6,7,0 | 1,0,3,2,5,4,7,6 | up | up | up | 3 |
| | 010 | 2,3,4,5,6,7,0,1 | 2,3,0,1,6,7,4,5 | up | up | down | 3 |
| | 011 | 3,4,5,6,7,0,1,2 | 3,2,1,0,7,6,5,4 | up | up | down | 3 |
| | 100 | 4,5,6,7,0,1,2,3 | 4,5,6,7,0,1,2,3 | up | up | up | 3 |
| | 101 | 5,6,7,0,1,2,3,4 | 5,4,7,6,1,0,3,2 | up | up | up | 3 |
| | 110 | 6,7,0,1,2,3,4,5 | 6,7,4,5,2,3,0,1 | up | up | down | 3 |
| | 111 | 7,0,1,2,3,4,5,6 | 7,6,5,4,3,2,1,0 | up | up | down | 3 |

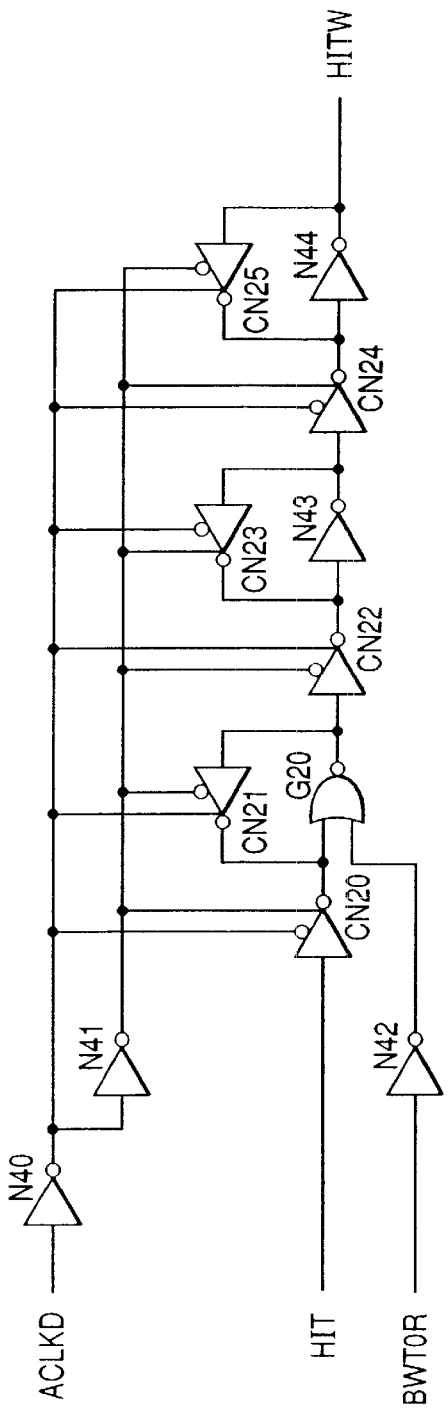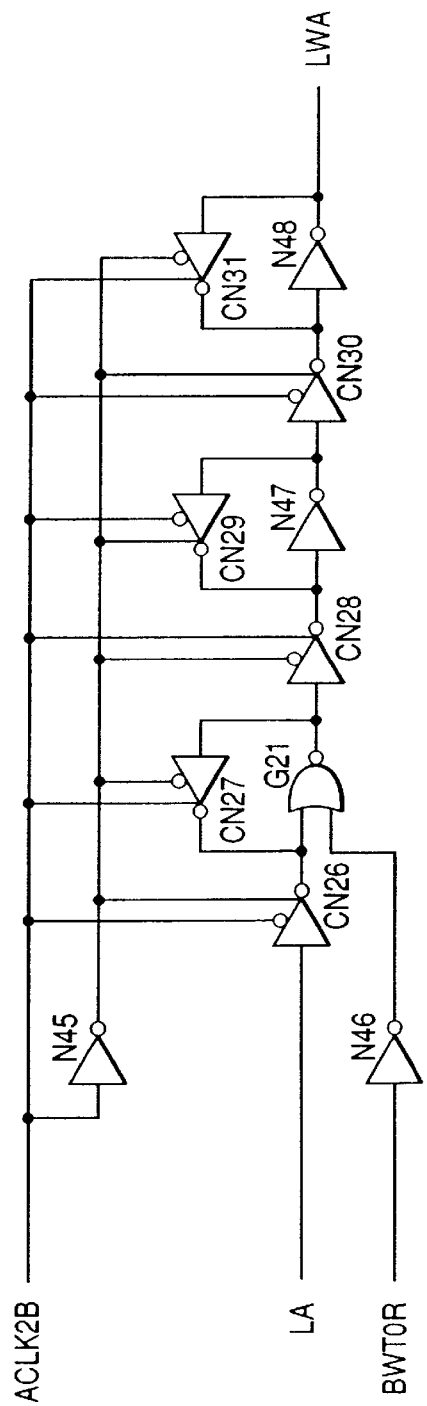

SEMICONDUCTOR MEMORY DEVICE

This is a continuation of parent application Ser. No. 09/789,753, filed Feb. 22, 2001, now U.S. Pat. No. 6,385,100, the entire disclosure of which is hereby incorporated by reference.

BACKGROUND OF THE INVENTION

The present invention relates to a semiconductor memory device and, more particularly, to a technique which is effective when used in a column selecting operation for the bursting actions of a synchronous dynamic RAM (Random Access Memory).

The synchronous DRAM (Dynamic RAM) is provided on a chip with an address counter for performing bursting actions. The synchronous DRAM is standardized to include an input unit for receiving an external address; an address counter for calculating an address to be used in a next cycle from the received address; a redundant address comparator; a pre-decoder arranged in parallel with the redundant address comparator; an output buffer for controlling the pre-decoder output on the basis of the redundant comparison result; and a column decoder, as recited in the order of signal propagations.

A synchronous DRAM, which is provided with an address shift register at the downstream stage of the pre-decoder and the redundant circuit to form an address signal for a burst action by its shifting action, so as to speed up the column selecting action, has been disclosed in Japanese Patent Laid-Open No. 275073/1994 or 320269/1997 (corresponding to U.S. Pat. No. 6,009,038).

SUMMARY OF THE INVENTION

In accordance with the speed-up of the operating frequency of a MPU (Micro Processor Unit), there has been a demand to raise the speed of the DRAM. In the standard circuit construction, which is provided with an address counter for calculating an address to be used in a next cycle from the address of an input unit for receiving an external address, however, the address cannot be advanced until the command decoder generates a column action signal, so that fast access is delayed. In the synchronous DRAM disclosed in the aforementioned Patent publication, therefore, the speed-up of the fast access and the count-up of the address can be realized by a shifting action because a shift register is disposed at the downstream stage of the pre-decoder. Thus, the cycle can be speeded up.

However, the synchronous DRAM as disclosed is able to cope with only the burst mode of a simple shifting action, but not an interleave action mode demanding a complex change in the address for an initial address. For a burst length of 8, for example, the interleave action mode is $0 \to 1 \to 2 \to 3 \to 4 \to 5 \to 6 \to 7$ as in the sequential action mode, if the value is 0. If the initial value is 1, however, the mode is $1 \to 0 \to 3 \to 2 \to 5 \to 4 \to 7 \to 6$. If the initial value is 2, the mode is $2 \to 3 \to 0 \to 1 \to 6 \to 7 \to 4 \to 5$. Thus, the shift registers, as disclosed in the above-mentioned publications cannot solve the problem in the least. Specifically, Japanese Patent Laid-open No. 320269/1997 has failed to take into consideration the redundant circuit, and Japanese Patent Laid-Open No. 275073/1994 has a problem in that the circuit scale is enlarged by the provision of the redundant circuit with a similar shift register.

An object of the invention is to provide a semiconductor memory device which can realize various burst actions while speeding up the actions.

Another object of the invention is to provide a semiconductor memory device which can realize simplification of the redundant circuit while speeding up the actions.

The aforementioned and other objects and novel features of the invention will become apparent from the following description to be made with reference to the accompanying drawings.

A summary of representative aspects of the invention to be disclosed will be briefly described in following. Specifically, a semiconductor memory device comprises a memory array including a plurality of word lines and a plurality of bit lines; and a column address decoder for selecting a predetermined bit line from the plurality of bit lines. The column address decoder includes first and second pre-decoders corresponding to high-order and low-order addresses, respectively; a shift register for using the output signal of the second pre-decoder as an initial value; and an output circuit for selecting either the output signal of the second pre-decoder or the output signal of the shift register in accordance with an action mode. The select signal is formed by the output signal of the first pre-decoder and the output signal obtained through the output circuit. The shift register includes a first shift register for an even address and a second shift register for an odd address. Thus, the continuous selecting signals of the bit lines, as composed of a sequential action and an interleave action, are formed on the basis of the initial value by combining its up and down shifting actions.

The summary of the representative embodiments of the invention to be disclosed will be briefly described in the following. Specifically, a semiconductor memory device comprises: a memory array including a plurality of word lines, a plurality of bit lines and a redundant bit line; and a column address decoder for selecting a predetermined bit line from the plurality of bit lines. The column address decoder includes: first and second pre-decoders corresponding to high-order and low-order addresses, respectively; a shift register for using the output signal of the second pre-decoder as an initial value; and an output circuit for selecting either the output signal of the second pre-decoder or the output signal of the shift register in accordance with an action mode. A redundant circuit for switching to the redundant bit line includes: a comparator for comparing such one of the faulty addresses stored in the memory circuit as corresponds to the high-order address and the address signal inputted; a redundant pre-decoder for decoding the low-order address of the faulty addresses; and a coincidence detect circuit for detecting the compared coincidence output of the comparator and a coincidence between the individual outputs of the redundant pre-decoder and the second pre-decoder. A predetermined bit line is selected from the redundant bit lines by the redundant bit line select circuit in response to the detected signal of the coincidence detect signal in place of the select signal formed in the column address decoder.

BRIEF DESCRIPTION OF THE DRAWINGS

FIG. 6 is a table for explaining the burst mode actions of the synchronous DRAM according to the invention;

FIG. 12 is a circuit diagram showing one embodiment of a hit register of FIG. 3;

FIG. 13 is a circuit diagram showing one embodiment of a write address register of FIG. 3;

DETAILED DESCRIPTION OF THE INVENTION

Figure 1:
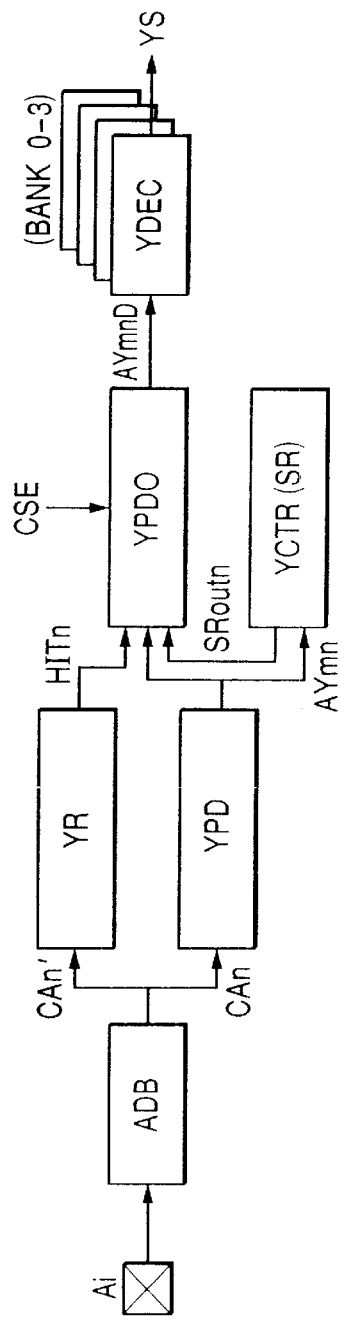
FIG. 1 is a fundamental block diagram showing one embodiment of a column select circuit of a synchronous DRAM according to the invention.
Figure 2:
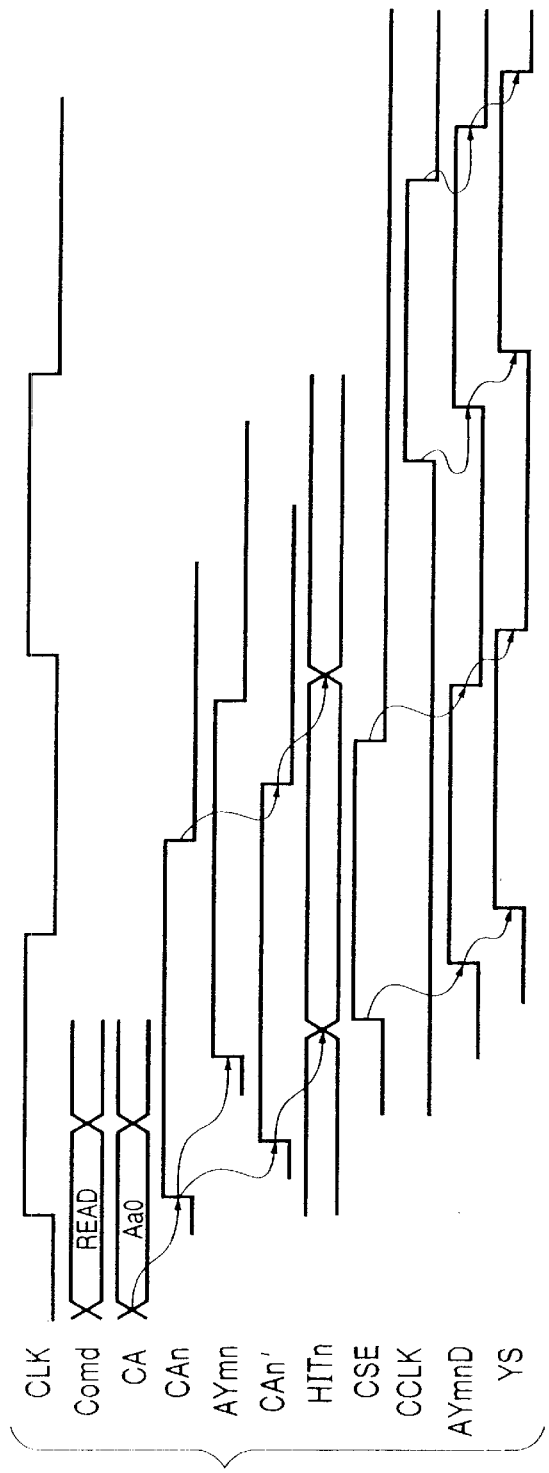
FIG. 2 is a waveform diagram for explaining the operations of the column select circuit of FIG. 1.

FIG. 1 is a fundamental block diagram showing one embodiment of a column select circuit of a synchronous DRAM according to the invention, and FIG. 2 is an action waveform diagram of the same. An address counter YCTR, which is located next to an address buffer ADB in the standard synchronous DRAM of the prior art, is moved to next to a pre-decoder YPD in this embodiment. In other words, an internal address signal CAn, fetched by the address buffer ADB, is fed to an address comparator YR, which forms a Y-redundant circuit, and to the column-pre-decoder YPD. However, the address counter YCTR of this embodiment is not a so-called "binary counter circuit", but is constructed of a shift register SR.

With this construction, the address counter YCTR is eliminated from the critical path for determining the access speed, and the address CAn can be inputted to the column pre-decoder YPD, whereas an address signal CAn' can be inputted to the redundant address comparator YR, without awaiting the generation of a column action signal by the not-shown command decoder, so that the fast access can be speeded up. On the other hand, the address counter YCTR can be counted up merely by shifting a pre-decoder output AYmn so that a counting-up operator, such as the binary counter of the prior art, can be omitted while speeding up the cycle.

In the circuit construction thus far described, what is inputted to the address comparator YR is the address signal CAn', which has been inputted from the outside through the address buffer ADB, but not the counter address in the burst action. Thus, another circuit is needed for interrupting the normal line to generate a redundant column select signal when the counter address YCTR becomes identical to the redundant address to form a hit signal HITn. For this necessity, in this embodiment, the hit signal HITn of the redundant address comparator YR is fed to a pre-decoder output buffer YPDO, by which the switching is batched between the normal circuit and the redundant circuit and between the burst action and the normal action.

In FIG. 2, a command Comd is inputted in synchronism with a clock CLK, and a read mode (READ) is designated by the command, so that a column address CA (Aa0) is fetched as the internal address CAn in synchronism with the clock signal CLK. The column address pre-decoder YPD forms the decoder signal AYmn. In parallel with this, the internal address signal CAn', is inputted to the address comparator of the redundant circuit and is compared with a faulty address to form the coincidence signal HITn.

The read mode is determined by the command decoder to form a decoder enable clock signal CSE. In dependence upon whether the redundant circuit is coincident or non-coincident, a pre-decoder output buffer YPDO selects the output signal (AYmn) of the column pre-decoder YPD if non-coincident and selects the redundant select signal produced by the redundant circuit if coincident. The output signal AYmnD of the pre-decoder output buffer YPDO is fed to a column decoder YDEC to form a column select signal YS. In synchronism with a clock signal CCLK, the address counter (or the shift register) YCTR performs the shift action, if in the burst mode, to form a pre-decode signal (SRoutn) corresponding to a next address. This pre-decode signal is outputted by the pre-decoder output buffer YPDO so that the column select signal YS is formed by the column decoder YDEC.

Thus, the read mode is determined by the command decoder so that the second and later cycles of the column selecting action of the fast access in response to the decoder enable clock signal CSE and the burst action in response to the clock signal CCLK can be realized at a high speed with the signal SRoutn generated by the shift action of a mere shift register.

Figure 3:
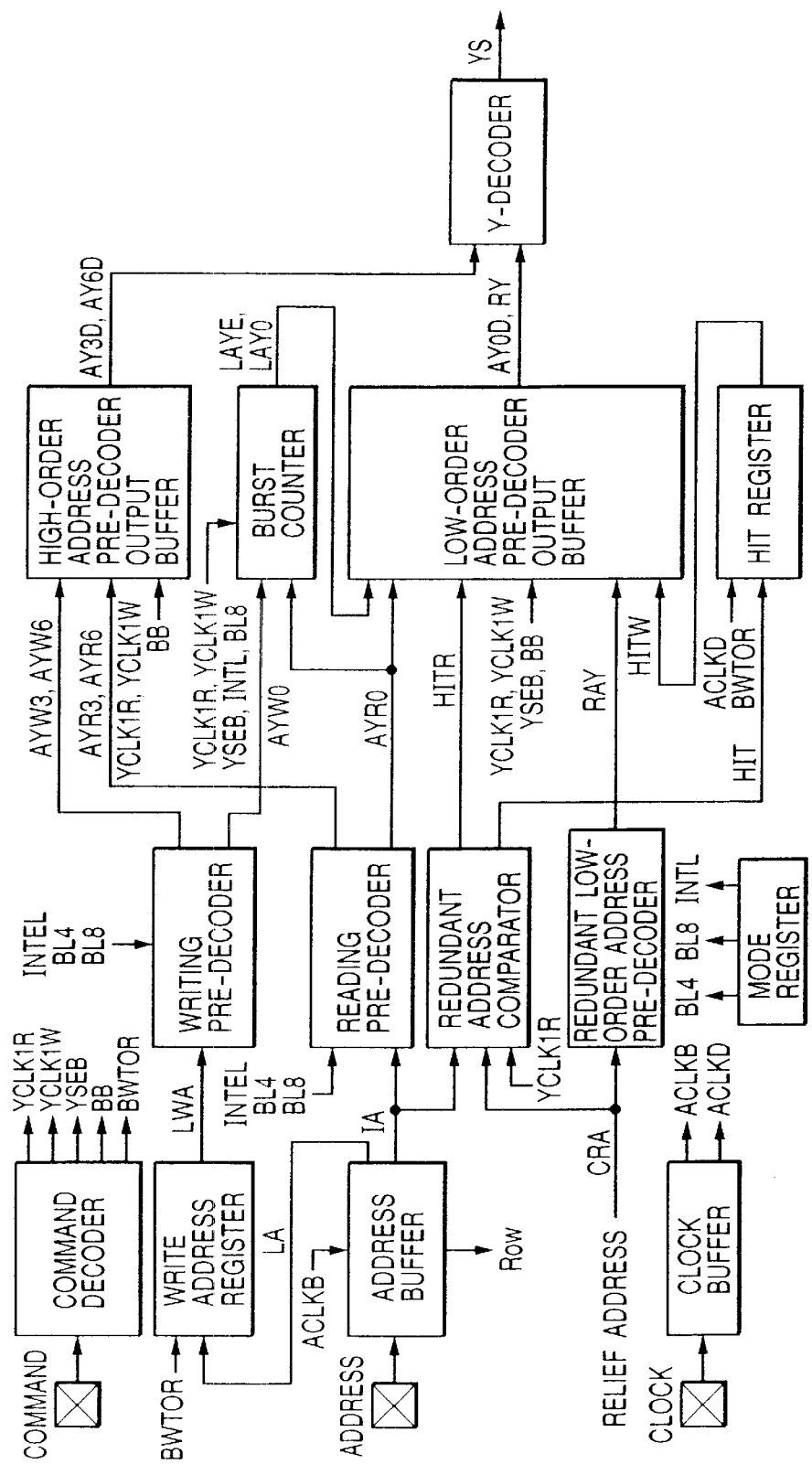
FIG. 3 is a specific block diagram showing one embodiment of the column select circuit of the synchronous DRAM according to the invention.

FIG. 3 is a specific block diagram of one embodiment of the column select circuit of the synchronous DRAM according to the invention. In this embodiment, the pre-decoder YPD is divided into a writing pre-decoder and a reading pre-decoder. This will be explained, as follows. In accordance with the high speed of the clock signal CLK, the column selecting action has to be delayed to correspond to the signal delay until the write data are transmitted to the column select circuit in the write mode. The address signal through the address buffer is delayed two blocks by the write address register into an address signal LWA, for example, which is fed to the writing pre-decoder. In accordance with the delay in the column selection in the write mode, the hit signal in the redundant address comparator is inputted to the hit register, in which it is delayed two clocks, for example, in accordance with the clock signal so that a hit signal HITW in the write mode is delayed according to the column selecting action in the write mode to switch the faulty bit line to the redundant bit line.

The writing and reading pre-decoders are further divided into low- and high-order addresses corresponding to the burst lengths. Where the burst lengths are 2, 4 and 8, for example, address signals of 3 bits of the low-order address for designating 0 to 7 are inputted to the low-order pre-decoder so that the decoding action of 1/8 is made. The column selecting address signals other than 3 bits are made to belong to the high-order addresses and are decoded by the high-order pre-decoder.

The redundant address comparator is constructed to include: an address comparator for comparing the high-order addresses of the address signals, as inputted through the address buffer, and the high-order addresses of the corresponding relieved addresses; and a decision circuit for detecting a coincidence between the decode signals of the low-order addresses of the relieved addresses and the output of the comparator. Thus, the redundant address comparator generates a plurality of coincidence signals corresponding to the burst lengths.

Specifically, the redundant address comparator compares the addresses on the high-order addresses, except for the individual 3 bits of the redundant (or relieved) addresses, and the external input addresses. If coincident, the redundant address comparator outputs the pre-decode signal on the low-order 3 bits of the-redundant (or relieved) addresses to the pre-decoder output buffer. The pre-decoder output buffer of the low-order addresses latches the redundant address decode signal and compares it with the pre-decode signal of the external input addresses or the output signal of the address counter (or the burst counter) for each clock cycle. If coincident, the pre-decoder output buffer interrupts the normal column decoder to generate the redundant column select signal. This embodiment is provided with separate redundant address comparators for the respective banks so as to speed up the actions, as will be described hereinafter, where the synchronous DRAM has a plurality of memory banks.

Of the writing and reading pre-decoders, pre-decode outputs AYW3 and AYW6, and AYR3 and AYR6 corresponding to the high-order addresses are inputted through the high-order address pre-decoder output buffer to the Y-decoder. This Y-decoder forms the column select signal YS from the low-order pre-decode signal AY0D or RY and the high-order pre-decode signal AY3D or AY6D.

In response to the command designated by the combination of the control signals fed from the external terminals, the command decoder forms various control signals. In the same Figure, there are exemplified only the representative control signals which correspond to the selecting actions of the column line. In response to the clock signal fed from the external terminal, the clock buffer forms the internal clock signals. In the same Figure, there are exemplified only the representative clock signals which are used in the selecting actions of the column line. On the other hand, the mode register sets the various modes. In the same Figure, however, there are exemplified only the representative control signals corresponding to the selecting actions of the column 9 line.

Figure 4:
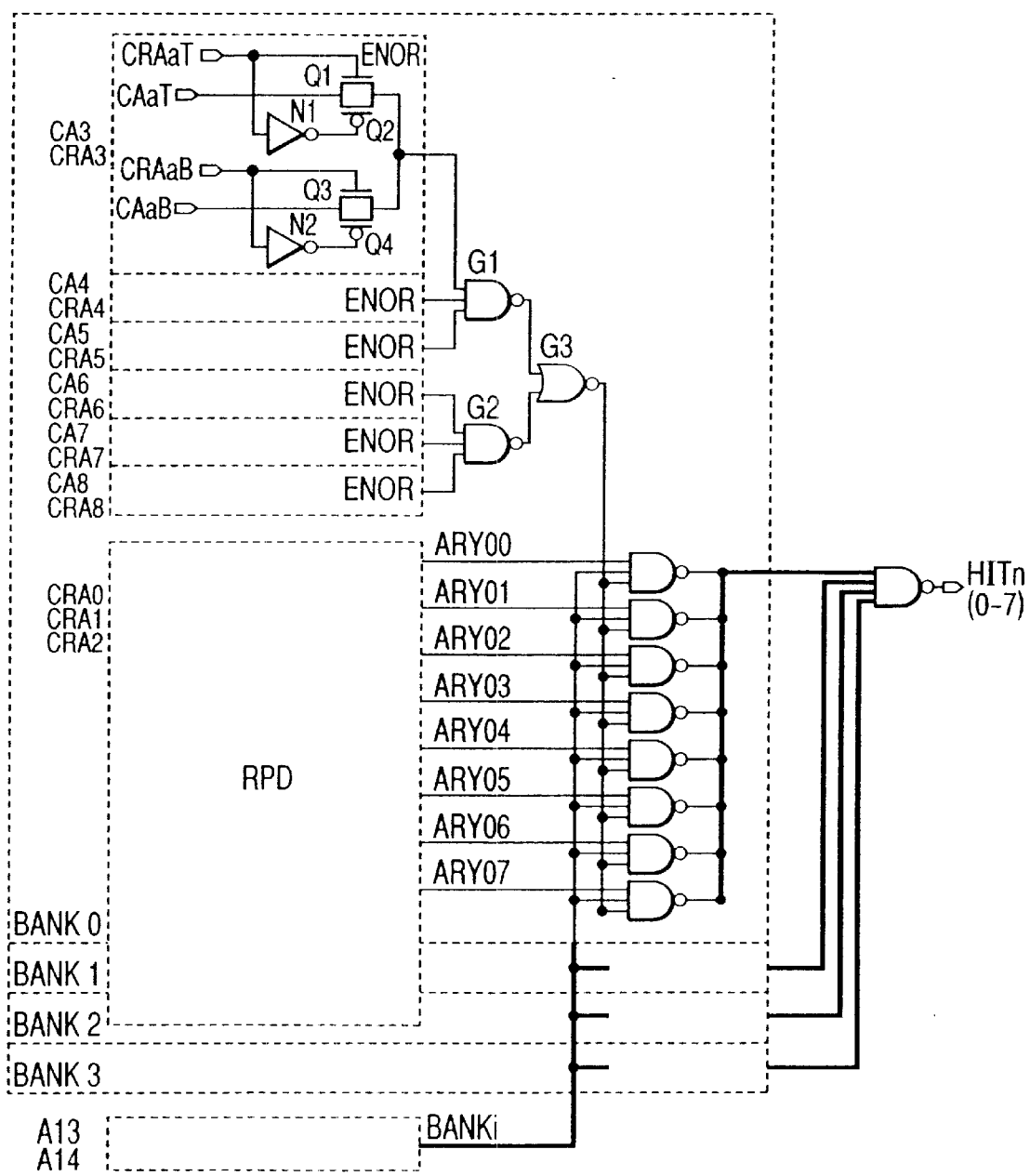
FIG. 4 is a schematic circuit diagram showing one embodiment of a redundant address comparator of FIG. 3.

FIG. 4 is a schematic circuit diagram showing one embodiment of the redundant address comparator. This address comparator is provided with an address comparator for comparing the coincidence between the address signals CA3 to CA8, except for the low-order 3 bits of column address signals CA0 to CA8, and the corresponding relief addresses CRA3 to CRA8. This address comparator is constructed, as represented by an exclusive OR circuit ENOR of 1 bit corresponding to the address signals CA3 and CRA3, of two sets of circuits which are composed of inverter circuits N1 and N2, N-channel type MOSFETs Q1 and Q3 and P-channel type MOSFETs Q2 and Q4.

In response to a non-inverted relief address CRAaT and the output signal of the inverter circuit N1, the CMOS switch composed of the MOSFETs Q1 and Q2 is controlled to transmit a non-inverted address signal CAat inputted through the CMOS switch. In response to an inverted relief address CRAaB and the output signal of the inverter circuit N2, the CMOS switch composed of the MOSFETs Q3 and Q4 is controlled to transmit an inverted address signal CAaB inputted through the CMOS switch. The outputs of these two CMOS switches are made common (by the wired OR logic) to generate an output signal.

For example, the non-inverted relief address CRAaT is at the high level, and the non-inverted address signal CAat inputted is at the same high level so that they are coincident. In this case, the CMOS switch composed of the MOSFETs Q1 and Q2 is turned ON to transmit the high level of the non-inverted address signal CAat to the output. On the other hand, the inverted relief address CRAaB is at the high level, and the inverted address signal CAaB inputted is at the same high level so that they are coincident. In this case, the CMOS switch composed of the MOSFETs Q3 and Q4 is turned ON to transmit the high level of the inverted address signal CAaB to the output. In short, the coincidence signal at the high level is outputted, where the relief address and the input address are coincident.

For example, the non-inverted relief address CRAaT is at the high level, and the non-inverted address signal CAat inputted is at the low level so that they are non-coincident. In this case, the CMOS switch composed of the MOSFETs Q1 and Q2 is turned ON to transmit the low level of the non-inverted address signal, CAat to the output. On the other hand, the inverted relief address CRAaB is at the high level, but the inverted address signal CAaB inputted is at the low level so that they are non-coincident. In this case, the CMOS switch composed of the MOSFETs Q3 and Q4 is turned ON to transmit the low level of the inverted address signal CAaB to the output. in short, the non-coincidence signal at the low level is outputted, where the relief address and the input address are non-coincident.

For the remaining bits CA4 to CA8 and CRA4 to CRA8, there are provided similar exclusive OR circuits ENOR, the individual coincidence signals of which are dispersed and inputted to three-input NAND gate circuits G1 and G2. The logic sum of the outputs of the NAND gate circuits G1 and G2 is taken as a whole by a NOR gate circuit G3. This NOR gate circuit G3 forms the output signal at the high level (or the logic 1), where all the bits CA3 to CA8 and CRA3 to CRA8 are coincident.

The relief addresses CRA0 to CRA2 of the low-order 3 bits are inputted to a redundant pre-decoder RPD so that they are converted into eight relief decode signals ARY00 to ARY07. These relief decode signals ARY00 to ARY07 are individually inputted to the NAND gate circuits. These NAND gate circuits are individually fed with the coincident signals of the address comparators.

Where the synchronous DRAM has four memory banks, a bank select signal BANK1, which is formed by a bank select circuit made receptive of address signals A13 and A14 selected by the bank, is fed to the inputs of the NAND gate circuits corresponding to the relief decode signals ARY00 to ARY07. The output signals of the individual gate circuits corresponding to these relief decode signals ARY00 to ARY07 are outputted as hit signals HITn (0 to 7), respectively. In the same Figure, the eight coincidence signals (0 to 7) are indicated by thick lines. With the 4-bank construction, the address comparators, the redundant pre-decoders RPD and the gate circuits are provided for the individual banks to form the eight coincidence signals HITn which are formed for the individual banks.

With the eight hit signals thus being formed by the column redundant circuit, the burst counter constructed of the shift register can select the redundant bit lines in place of the faulty bit lines when the corresponding select signals are formed. With this construction, the eight pairs of bit lines need not be changed in a batch for the burst lengths, for example, into the redundant circuits, so that an efficient defect relief can be made by the less redundant bit lines. Where the burst lengths can be set by a plurality of ways of 2, 4 and 8, on the other hand, a common redundant circuit can be used.

Figure 5:
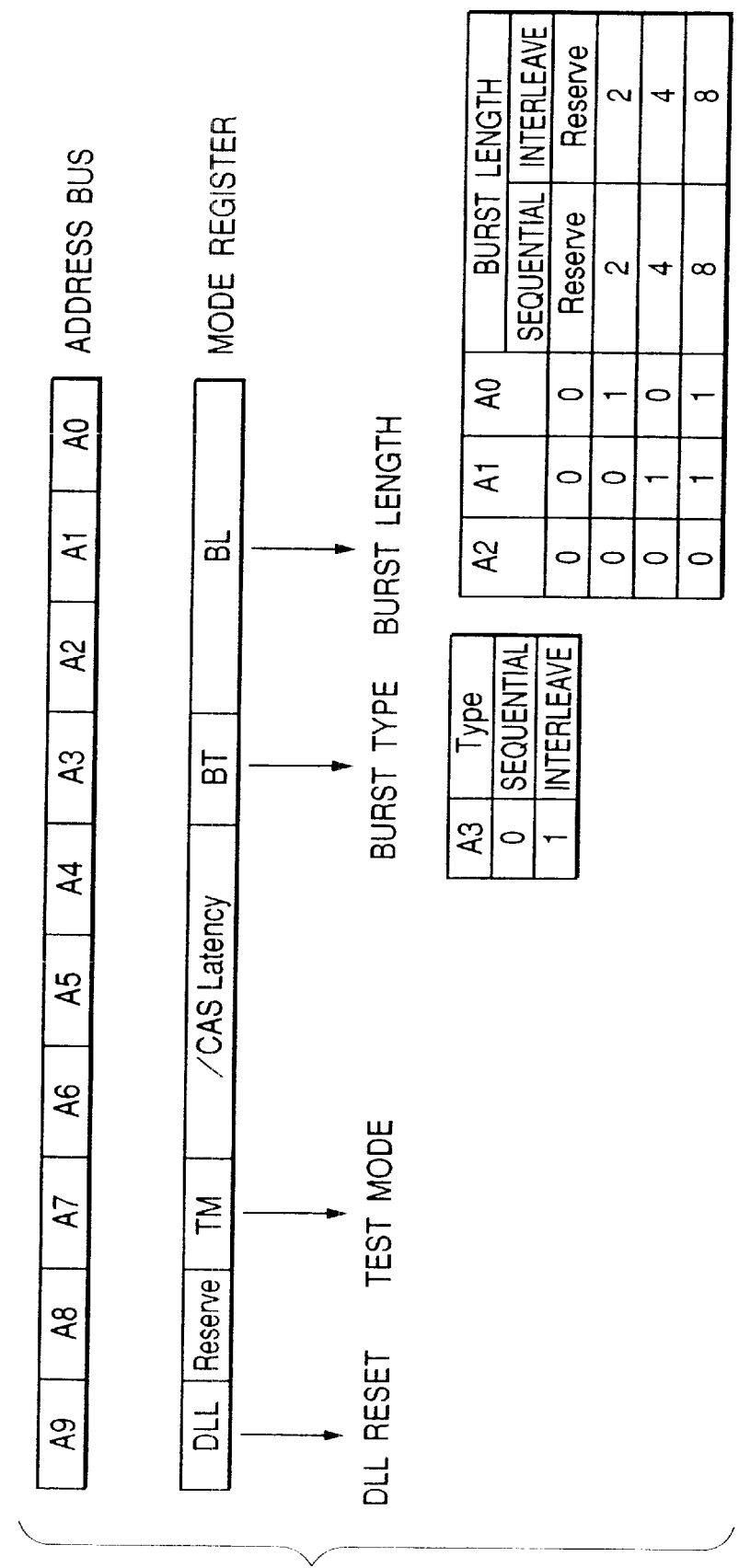
FIG. 5 is a diagram showing one embodiment of a mode register of FIG. 3.

FIG. 5 is a diagram of one embodiment of the mode register. This mode register is a register of 10 bits corresponding to address buses A0 to A9, of which the 3 bits corresponding to A0 to A2 are used for setting a burst length BL. In this embodiment, the 2, 4 and 8 burst lengths can be set by using A0 and A1 of the address signals A0 to A3. In the future, a burst length of $2^7=128$ can be designated by using the address signal A2 as well.

The 1 bit corresponding to the address signal A3 is used for setting a burst type BT. The action is made sequential, if the bit A3 is at the logic 0, but interleave if at the logic 1. The 3 bits corresponding to A4 to A6 will be used for setting the /CAS latency, although this is not directly related to the invention. The 1 bit corresponding to A7 is used for setting the test mode. The signal A8 is used for the preparation, and the signal A9 is used for resetting a DLL (or a synchronizer.

FIG. 6 is a table for explaining the burst mode actions of the synchronous DRAM according to the invention. The burst sequence of the synchronous DRAM is classified into the two kinds, i.e. sequential and interleave, for which the counting-up methods are different. The sequential mode can be coped with using a simple shifting action because a simple increment is sufficient. In the interleave mode, however, the burst length is 8, and in the sequence of 6→7→4→5→2→3→0→1, the interleave mode cannot be coped with using a simple shifting action.

In this embodiment, the investigations of the individual sequences in the interleave action mode have revealed that the sequences can be coped with using a simple shifting action if they are classified into odd and even ones. For the burst length of 8, as shown in FIG. 6, the sequence for the initial value 0 is 0→1→2→3→4→5→6→7 and is classified into the even one of 0→2→4→6 and an odd one of 1→3→5→7. Moreover, the sequence for the initial value 1 is 1→0→3→2→5→4→7→6. Although apparently complex, the sequence can be realized by classifying it into the same even and odd ones of 0→2→4→6 and 1→3→5→7 as those for the initial value 0.

For the initial values of 2 to 7, the sequence of 2→3→0→1→6→7→4→5 for the initial value 2 is apparently complex, but is divided into even and odd ones of 2→0→6→4 and 3→1→7→5. For the initial value 3, the sequence is 3→2→1→0→7→6→5→4 and is divided into even and odd ones of 2→0→6→4 and 3→1→7→5 so that the sequence can be realized by the same shift-down action as that for the initial value 2.

For the initial value 4, the sequence is 4→5→6→7→0→1→2→3 and is divided into even and odd ones of 4→6→0→2 and 5→7→1→3. For the initial value 5, the sequence is also apparently complex as is expressed by 5→4→7→6→1→0→3→2, but is divided into even and odd ones of 4→6→0→2 and 5→7→1→3 so that it can be realized by the same shift-up action as that for the initial value 4.

For the initial value 6, moreover, the sequence is 6→7→4→5→2→3→0→1 and is divided into even and odd ones of 6→4→2→0 and 7→5→3→1. For the initial value 7, the sequence is 7→6→5→4→3→2→1→0 and is divided into even and odd ones of 6→4→2→0 and 7→5→3→1.

For the burst length 4, the sequence for the initial value 0 is 0→1→2→3 and is divided into even and odd ones of 0→2 and 1→3. Moreover, as to the sequence for the initial value 1, the sequence is also apparently complex as 1→0→3→2, but is divided as above into even and odd ones of 0→2 and 1→3 so that it can be realized by the same shift-up action as that for the initial value 0. Moreover, the sequence for the initial value 2 is 2→3→0→1 and is divided into the shift-down actions of 2→0 and 3→1. The sequence for the initial value 3 is 3→2→1→0 and is divided as above into even and odd ones of 2→0 and 3→1 so that it can be realized by the same shift-down action as that for the initial value 2.

In the sequential action mode for the burst length 4, moreover, the sequence for the initial value 1 changes as 1→2→3→0 and is divided into even and odd ones 2→0 and 1→3 so that the even sequence can be realized by the shift-down action, whereas the odd sequence can be realized by the shift-up action. On the other hand, the sequence for the initial value 3 changes as 3→0→1→2 and is divided into even and odd ones 0→2 and 3→1 so that the even sequence can be realized by the shift-up action, whereas the odd sequence can be realized by the shift-down action. In the sequential action mode, all the sequences other than the aforementioned ones can be coped with by means of shift-up actions.

The pre-decoder outputs never fail to be outputted in pairs even and odd ones in combination according to the burst sequences shown in FIG. 6. Moreover, there are provided two counters, one for the even addresses and one for the odd addresses, which are enabled to cope with the aforementioned sequences by inverting the shift actions (into the shift-up and the shift-down actions).

Figure 7:
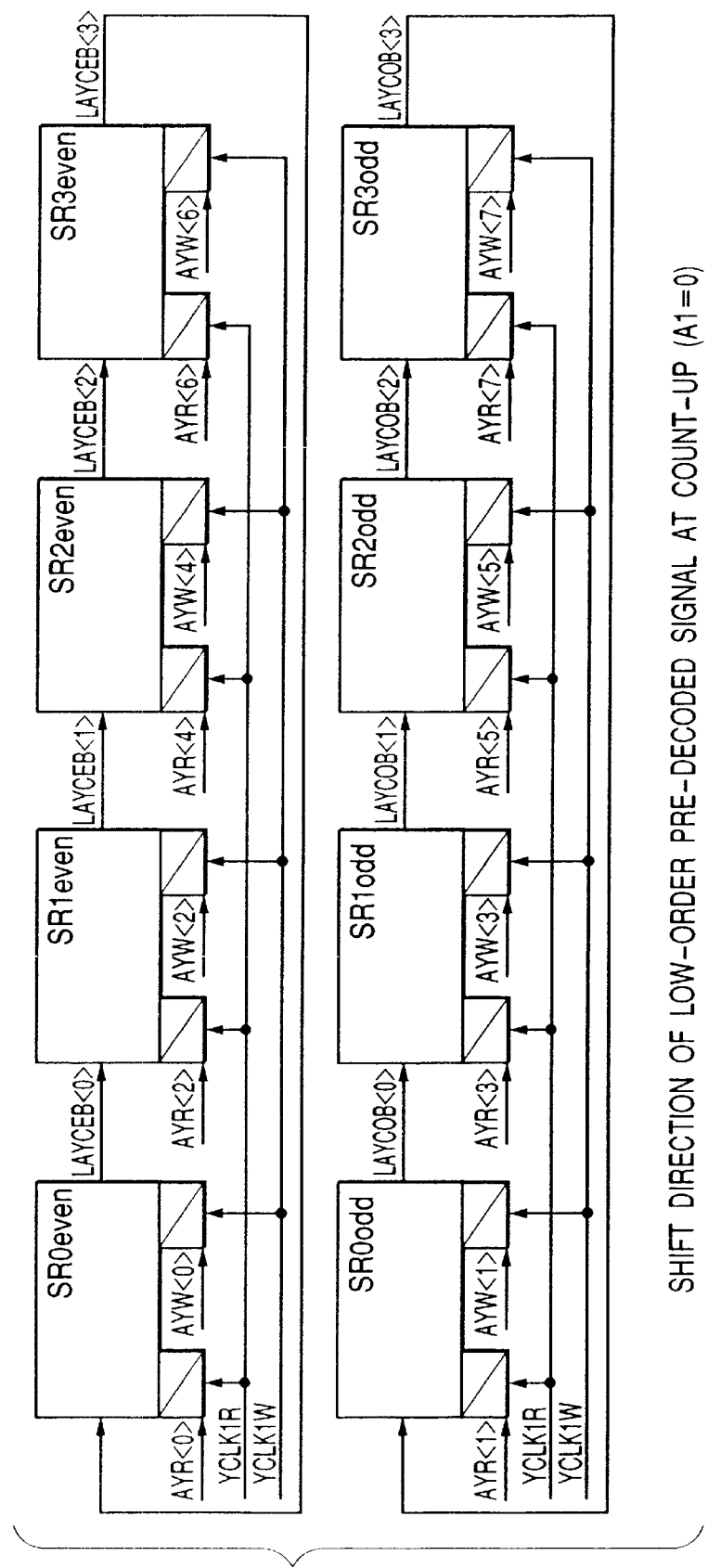
FIG. 7 is a block diagram for explaining one example of the actions of a shift register to be used in the burst actions of the synchronous DRAM according to the invention.
Figure 8:
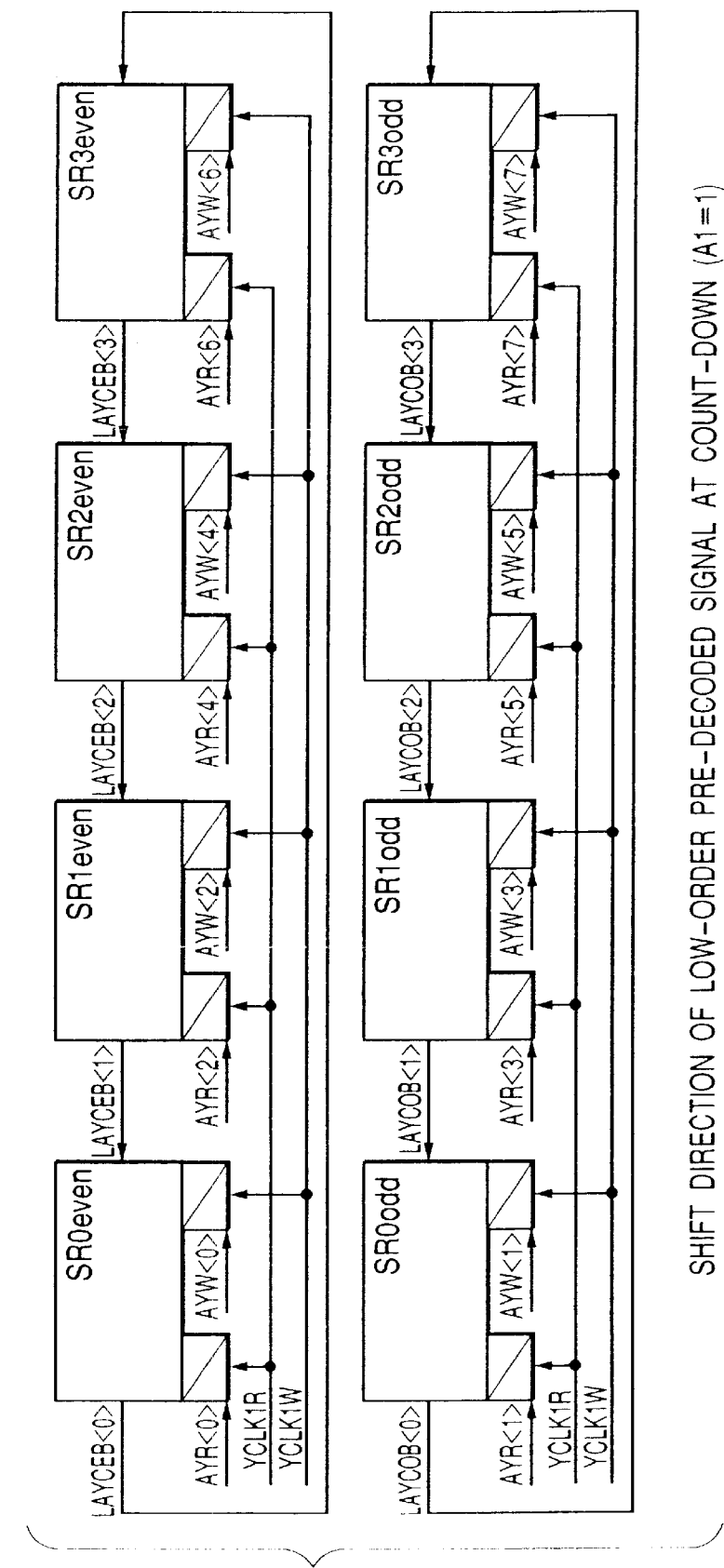
FIG. 8 is a block diagram for explaining another example of the actions of the shift register to be used in the burst actions of the synchronous DRAM according to the invention.

FIG. 7 and FIG. 8 are block diagrams of one embodiment of the shift register. FIG. 7 shows a shift direction of the low-order pre-decoded signal at the time of count-up (or shift-up), and FIG. 8 shows a shift direction of the low-order pre-decoded signal at the time of count-down (or shift-down). In FIG. 7 and FIG. 8, an even shift register SR0even to SR3even will fetch writing and reading pre-decoded signals AYW<2> to AYW<6> and AYR<0> to AYR<6> individually in response to timing signals YCLKLW and YCLKLR. An odd shift register SR0odd to SR3odd will fetch writing and reading pre-decoded signals AYW<1> to AYW<7> and AYR<1> to AYR<7> individually in response to timing signals YCLKLW and YCLKLR.

In the interleave action mode, as shown in FIG. 6, the reading and writing pre-decoders input a select signal at the logic 1 individually to even and odd shift registers SR0, SR1, SR2 and SR3 when pairs of outputs corresponding to the even and odd actions have the initial values of 0 and 1, 2 and 3, 4 and 5, and 6 and 7. In the sequential action mode, for each of the initial values 0, 1, 2, 3, 4, 5, 6 and 7, the two pre-decoded signals 0 and 1, 1 and 2, 2 and 3, 3 and 4, 4 and 5, 5 and 6, 6 and 7, and 7 and 0 are paired to feed the select signal at the logic 1 to the even and odd shift registers SR0, SR1, SR2 and SR3.

The pre-decoder output buffers, as shown in FIG. 3, are also so controlled that the even buffer and the odd buffer may be activated alternately for every cycle to determine the first activated buffer in response to the even and odd address inputted from the outside. Then, the construction thus far described can cope with the two kinds of burst sequences. In the case of 2-bit prefetch as in the DDR (Double Data Rate) SDRAM, on the other hand, the pre-decoder output buffers need not be controlled separately for the even and odd ones because two column select signals are simultaneously outputted.

Figure 9:
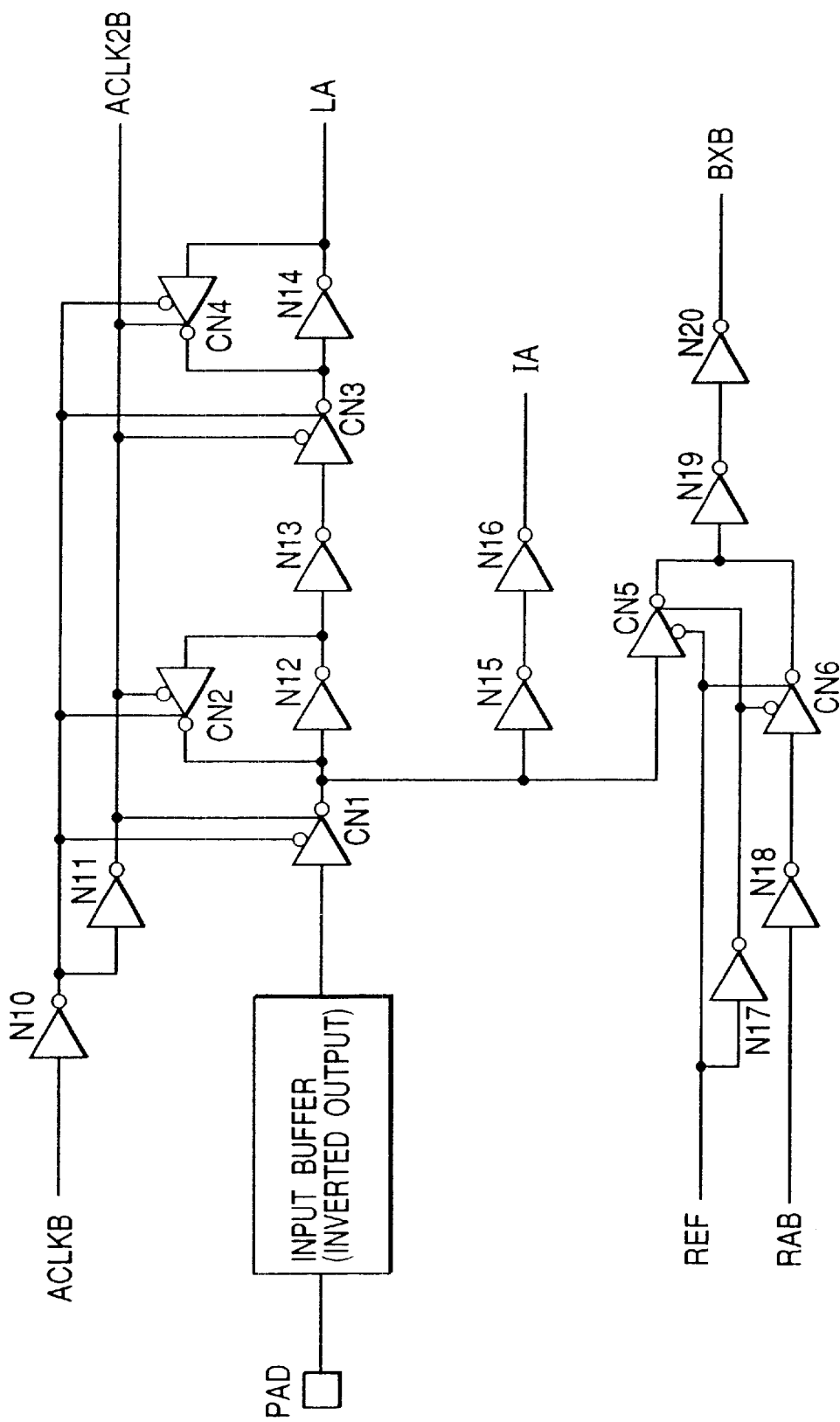
FIG. 9 is a circuit diagram showing one example of an address buffer of FIG. 3.

FIG. 9 is a circuit diagram showing one embodiment of the address buffer of FIG. 3. An input buffer having an input terminal connected with an external terminal (PAD) is formed of a CMOS inverter circuit to form an inverted signal. This inverted signal is synchronized with a clock signal ACLKB and fetched by a clocked inverter circuit CN1 to be activated by the clock signal ACLKB.

Inverter circuits N12 to N14 and clocked inverter circuits CN2 to CN4 form a through latch circuit to form a latch address LA to be transmitted to the write address register. Inverter circuits N15 and N16 form an internal address signal IA, which is fed to the reading pre-decoder and the redundant address comparator. A signal REF is a refresh control signal, by which a refresh address RAB is fetched as a row address signal BXB.

Figure 10:
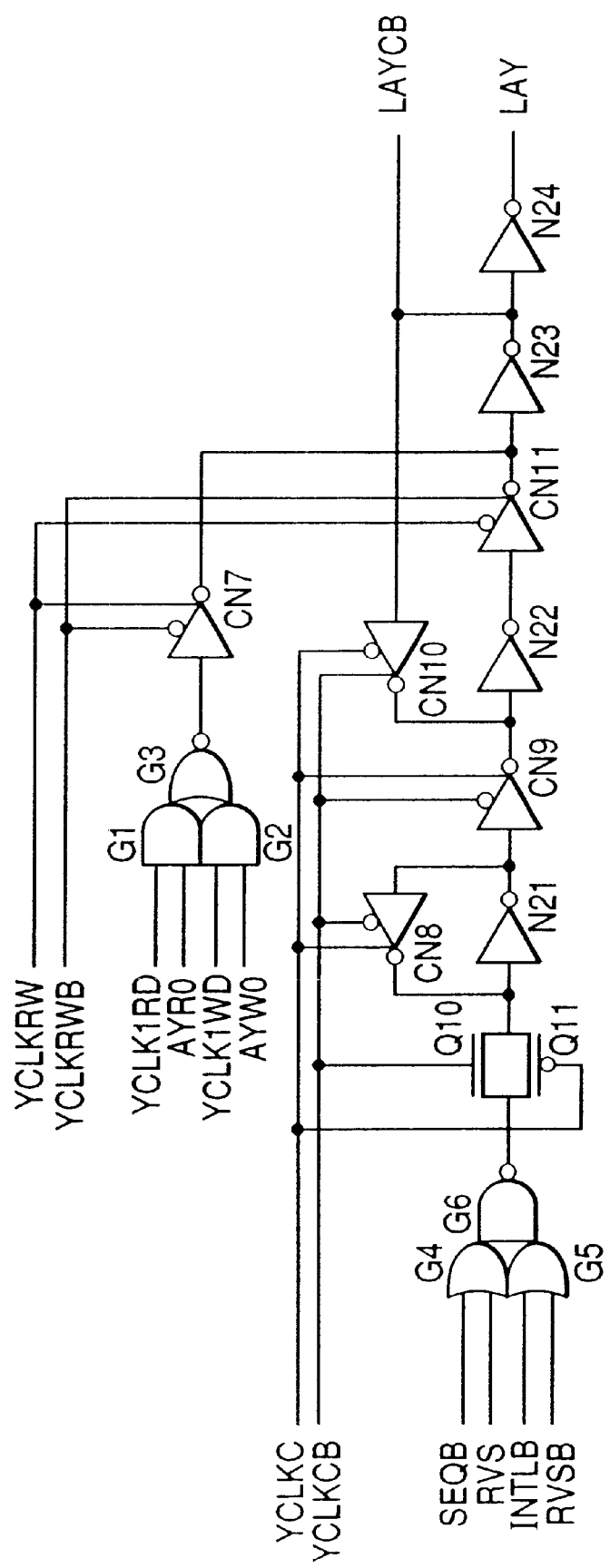
FIG. 10 is a circuit diagram showing one embodiment of the shift register to be used in the burst actions of the synchronous DRAM according to the invention.

FIG. 10 is a circuit diagram showing one embodiment of the shift register. The shift register of this embodiment is shown to have a circuit consisting of an even shift register and an odd shift register for 1 bit. In an input unit of the initial value, the reading pre-decode output AYR0 and the writing pre-decode signal AYW0 are fetched in response to clock signals YCLKLRD and YCLKLWD corresponding to the individual action modes. In response to a sequential SEQB and an interleave INTLB, input signals RVS and RVSB to be shifted are fetched through a CMOS switch, which is composed of MOSFETs Q10 and Q11, to be switched with clock signals YCLKC and YCLKCB, by a through latch circuit composed of an inverter circuit N21 and a clocked inverter circuit CN8, so that the shift action of 1 bit is performed by a latch circuit composed of clocked inverter circuits CN9, CN10 and CN11 and inverter circuits N22 and N23 at the downstream stage.

Figure 11:
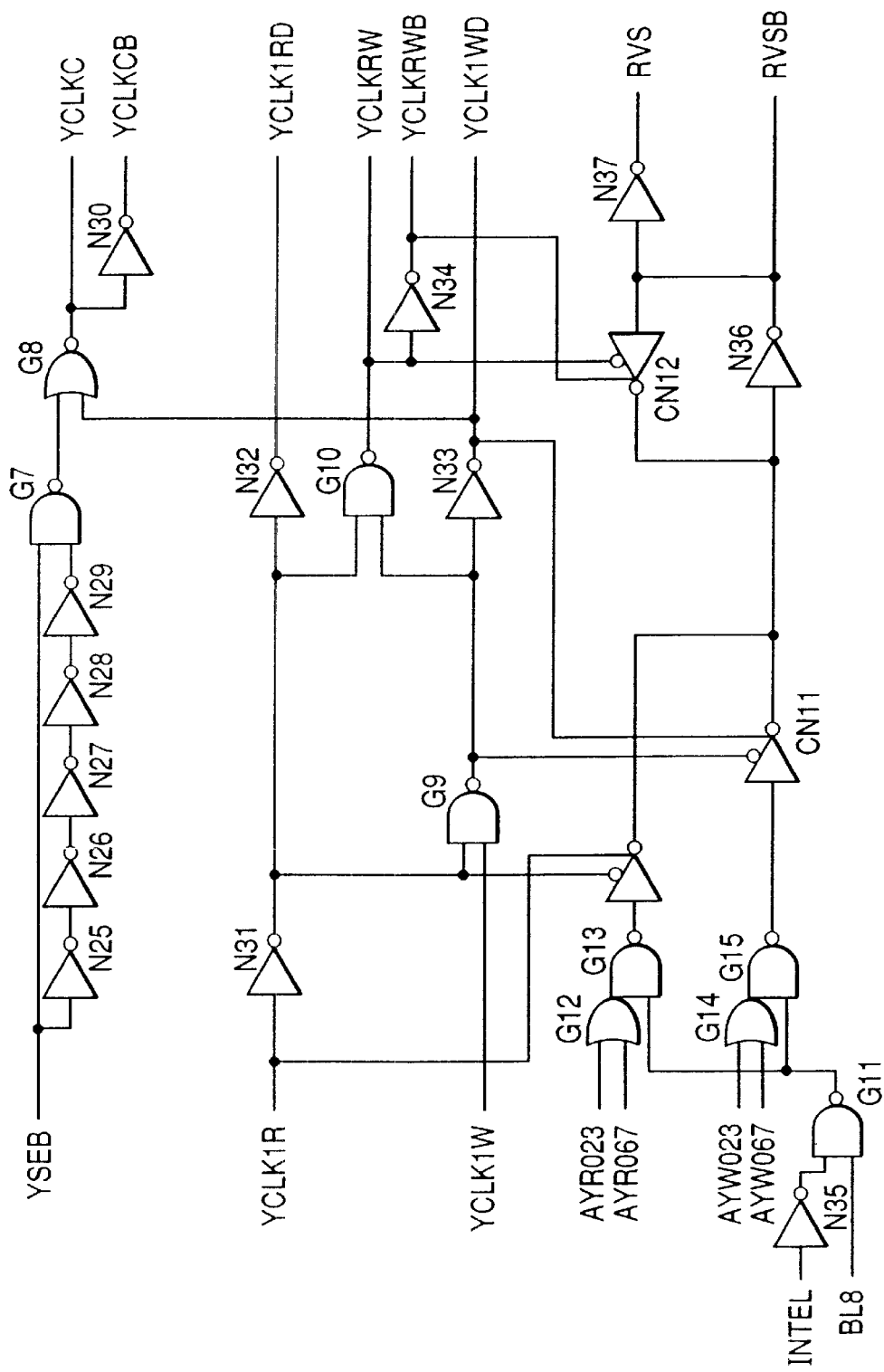
FIG. 11 is a circuit diagram showing one embodiment of a counter (or a shift register) to be used in the burst actions of the synchronous DRAM according to the invention.

FIG. 11 is a circuit diagram showing one embodiment of a counter (or a shift register) control circuit. In response to control signals INTEL and BL8, formed on tire basis of the burst type BT and the burst length BL set by the mode register, and signals AYR023 and AYR067, and AYW023 and AYW067, as formed on the basis of the clock signals YSEB, YCLKLR and YCLKLW and the pre-decoded output, the counter control circuit forms the control signals of the shift registers corresponding to the individual burst actions. In short, control signals are formed for setting the initial values and for the shift-up and shift-down actions, as shown in FIG. 6.

FIG. 12 is a circuit diagram showing one embodiment of the hit register. A hit signal HIT in the address comparator is delayed by 1.5 cycles and outputted through the three-stage latch circuit for the writing action and is delayed by 2 cycles of the clock signal CLK for the column selecting action, thereby to switch the faulty bit line to the redundant bit line. As a result, the write data inputted are delayed by 2 clocks and are written in the normal memory cell or redundant memory cell through the column switch.

FIG. 13 is a circuit diagram showing one embodiment of the write address register. The column address signal in the write mode is delayed by 1.5 cycles through the write address register composed of latch circuits of three stages and is fed to the writing pre-decoder. In the column selecting actions, two cycles of the clock signal CLK are delayed to form the select signal of the column switch thereby to retain the time period necessary for selecting the memory cells, so that the write data inputted may be written by 2 clocks in the selected normal memory cell or the redundant memory cell through the column switch.

Figure 14:
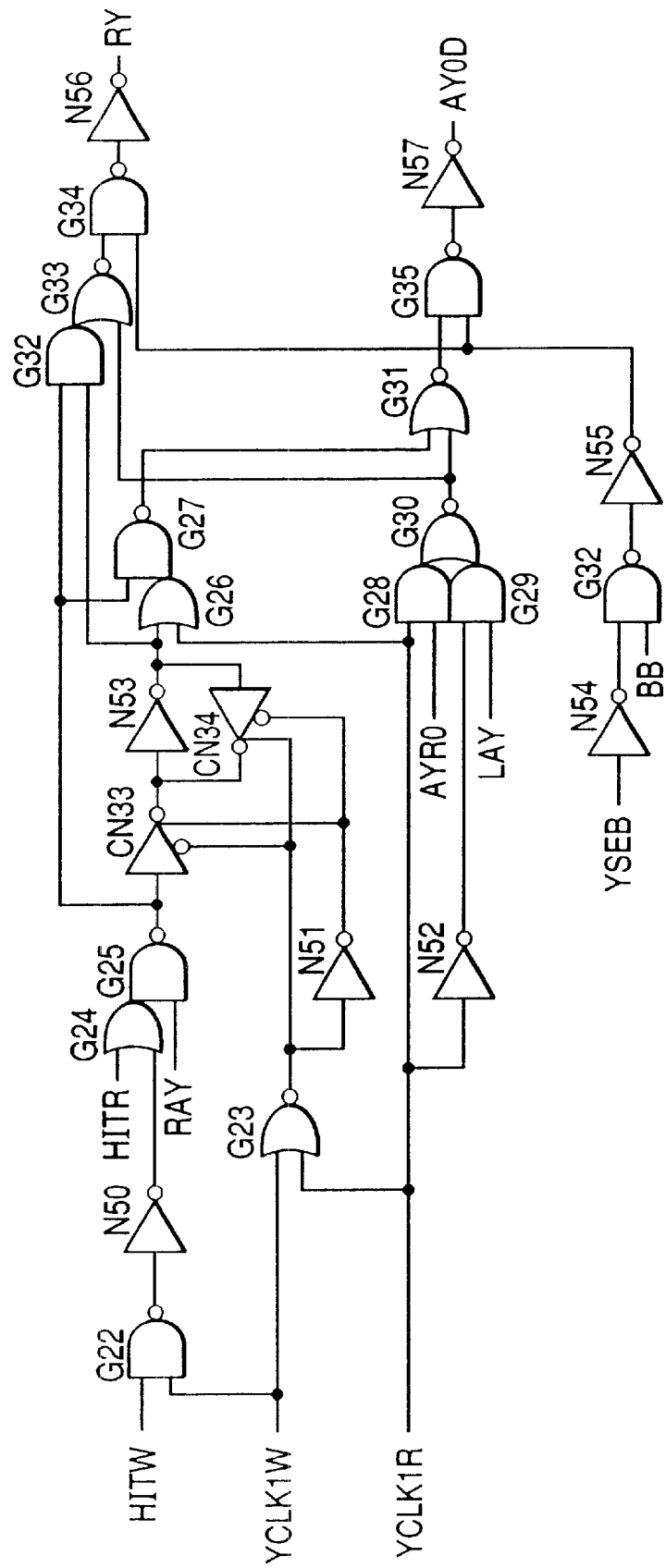
FIG. 14 is a circuit diagram showing one embodiment of a low-order address pre-decoder output buffer of FIG. 3.

FIG. 14 is a circuit diagram showing one embodiment of the low-order address pre-decoder output buffer. In response to the output signal AYR0 of the reading pre-decoder or a shift signal LAY formed by the shift register, the output of the output signal AYOD on the normal circuit side is inhibited, and the redundancy select signal RY is formed when the hit signal HITW or HITR is formed. The low-order address pre-decoded signal AYOD or the redundancy select signal RY is outputted in synchronism with the Y-timing signal YSEB.

Figure 15:
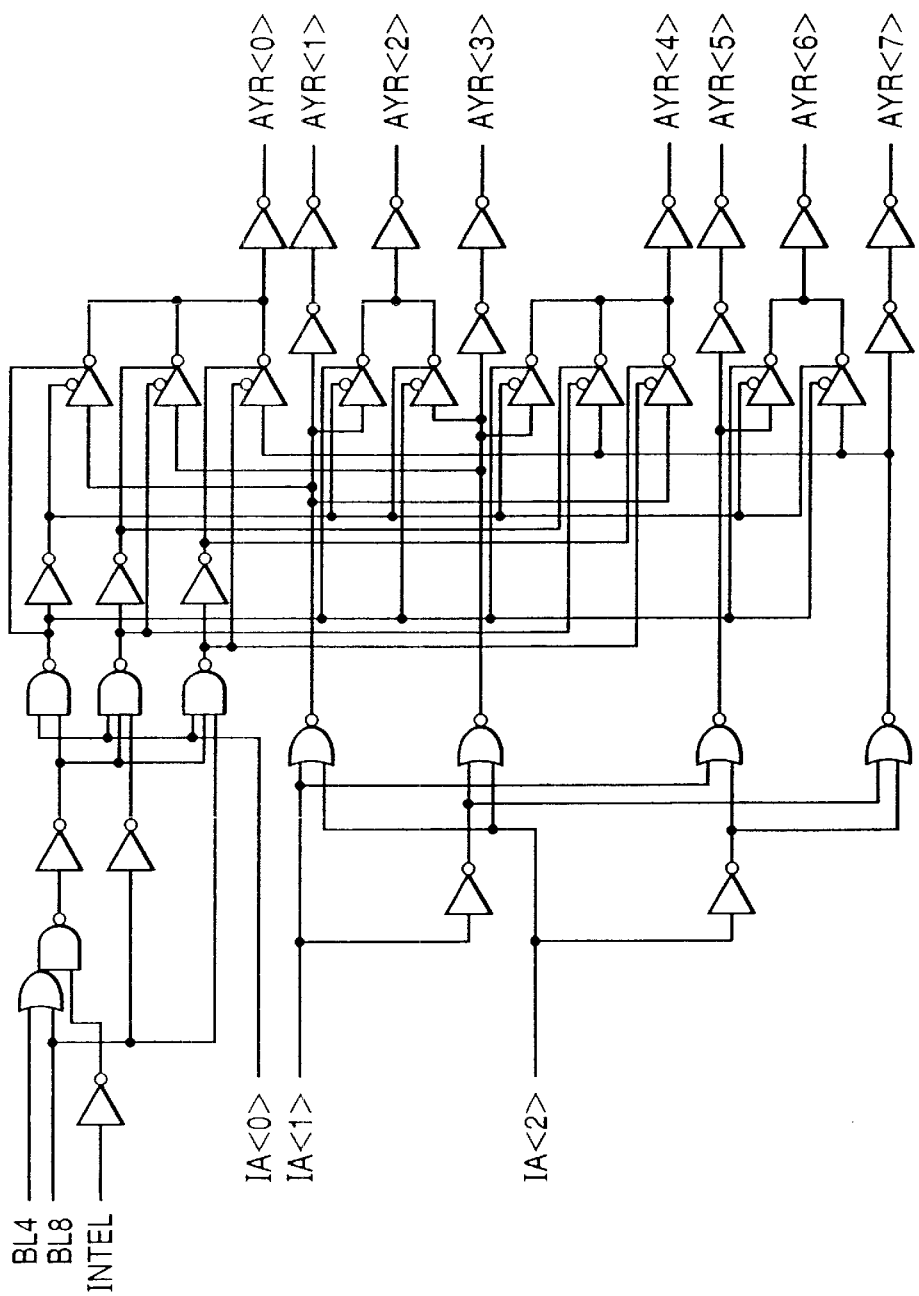
FIG. 15 is a circuit diagram showing one embodiment of a low-order address pre-decoder of FIG. 3.

FIG. 15 is a circuit diagram showing one embodiment of the low-order address pre-decoder. In accordance with the bit lengths BL4 and BL8 and the burst mode signal INTEL, four decode signals, the least significant bit IA<0>, the bit lengths BL8 and BL4 and the INTEL are combined in connection with the high-order 2 bits IA<1> and IA<2> of the 3-bit address signals IA<0>, IA<1> and IA<2>, thereby to form the initial values corresponding to the even and odd shift registers SR0, SR1, SR2 and SR3 corresponding to the sequential and interleave action modes.

In the sequential action mode, more specifically, for the individual initial values 0, 1, 2, 3, 4, 5, 6 and 7, the individual two pre-decoded signals AYR<0> and AYR<1>, AYR<1> and AYR<2>, AYR<2> and AYR<3>, AYR<3> and AYR<4>, AYR<4> and AYR<5>, AYR<5> and AYR<6>, AYR<6> and AYR<7> and AYR<7> and AYR<0> are paired to feed the select signal at the logic 1 to the even and odd shift registers SR0, SR1, SR2 and SR3.

Figure 16:
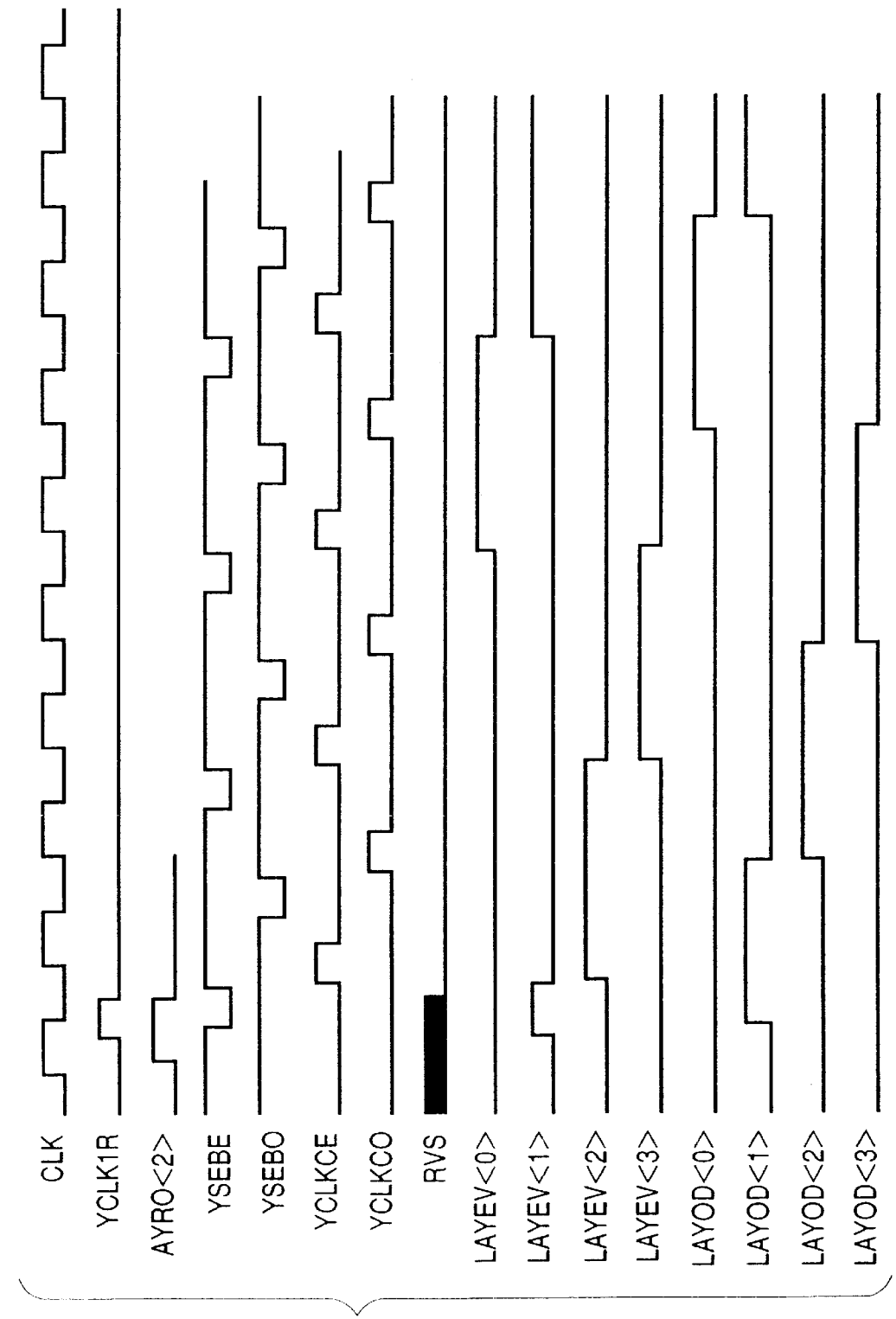
FIG. 16 is a waveform diagram for explaining one example of the burst counter actions of the synchronous DRAM according to the invention.

FIG. 16 is a waveform diagram for explaining one example of the burst counter actions of the synchronous DRAM according to the invention. This Figure relates to a case wherein the bit length is BL8 and the sequential start address <010>=2. In response to the timing signal YCLKR, for the initial value <010>=2, the even shift register LYEV<1> and the odd shift register LAYOD<1> are set to the logic 1.

In the even shift registers SR0even to SR3even of FIG. 7 or FIG. 8, the shift-up is carried out as LAYEV<1>→LAYEV<2>→LAYEV<3>→LAYEV<0> in synchronism with a clock signal YCLKCO. In short, the LAYEV<1> corresponds to AYR<2> so that the select signal is formed as ARY2→ARY4→ARY6→ARY0.

In the odd shift registers SR0odd to SR3odd of FIG. 7 or FIG. 8, the shift-up is made as LAYOD<1>→LAYOD<2>→LAYOD<3>→LAYOD<0> in synchronism with a clock signal YCLKCE. In short, LAYOD<1> corresponds to AYR<3> so that the select signal is formed as ARY3→ARY5→ARY7→ARY1.

Since the initial value is even at 2, the column select signal in the burst mode is formed in the sequence of 2→3→4→5→6→7→0→1 by outputting the output signals of the shift registers alternately in the even-odd order, if the initial value is at 2 in the sequential action mode.

Figure 17:
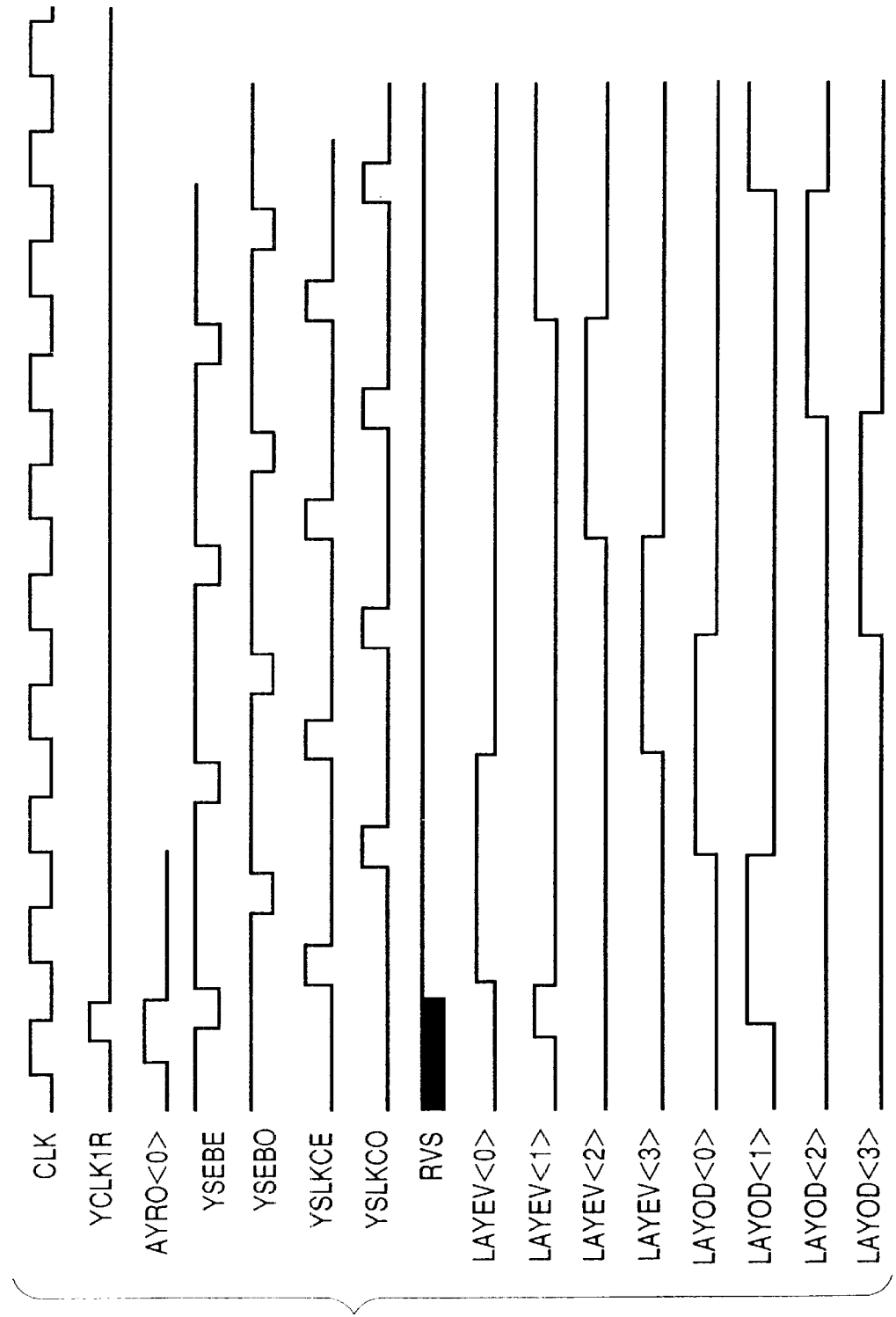
FIG. 17 is a waveform diagram for explaining another example of the burst counter actions of the synchronous DRAM according to the invention.

FIG. 17 is a waveform diagram for explaining one example of the burst counter actions of the synchronous DRAM according to the invention. This Figure relates to a case wherein the interleave start address<010>=2 for the bit length BL8. In response to the timing signal YCLK1R, an even shift register LYEV<1> and an odd shift register LAYOD<1> are set to the logic 1 if the initial value <010>=2.

In the even shift registers SR0even to SR3even of FIG. 7 or FIG. 8, the shift-down is carried out as LAYEV<1>→LAYEV<0>→LAYEV<3>→LAYEV<2> in synchronism with the clock signal YCLKCE. Since LAYEV<1> corresponds to AYR<2>, more specifically, there are formed the select signals of ARY2→ARY0→ARY6→ARY4.

In the odd shift registers SR0odd to SR3odd of FIG. 7 or FIG. 8, the shift-down is made as LAYOD<1>→LAYOD<0>→LAYOD<3>→LAYOD<2> in synchronism with the clock signal YCLKCO. Since LAYOD<1> corresponds to AYR<3>, more specifically, there are formed the select signals of ARY3→ARY1→ARY7→ARY5.

Since the initial value is even at 2, the column select signal in the burst mode is formed in the sequence of 2→3→0→1→6→7→4→5 by outputting the output signals of the shift registers alternately in the even-odd order, if the initial value is at 2 in the interleave action mode.

In this embodiment, by providing the shift register for the select signal in the burst mode downstream of the pre-decoder, the shift register as the address counter is omitted from the critical path for determining the access speed, and the address can be inputted to the column pre-decoder and the redundant address comparator without waiting for the command decoder to generate the column action signal, so that the fast access can be speeded up. Since the address counter is able to perform the count-up merely by shifting the pre-decoder output, on the other hand, the cycle can also be speeded up unlike the prior art without requiring the counting-up operator.

By dividing the shift registers into the two types, i.e. even-and odd ones, moreover, the select signal can be formed by simple shift-up or shift-down operations no matter whether the action mode might be sequential or interleave. Since the redundant circuit switches the redundant bit lines for the individual faulty bit lines, moreover, the defect relief can be effected by use of less redundant bit lines.

Figure 18:
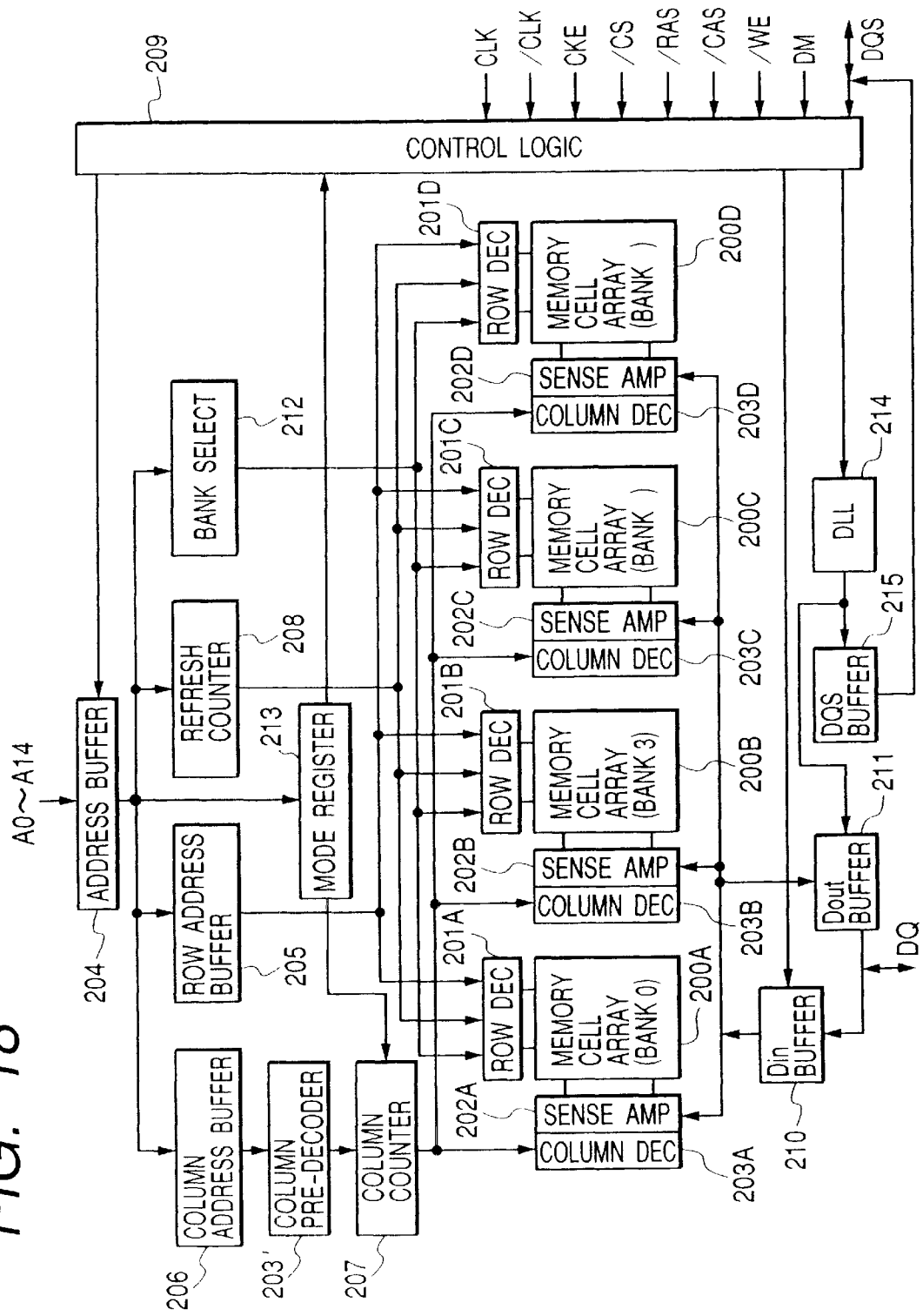
FIG. 18 is a block diagram showing the entirety of one embodiment of a DDR SDRAM, to which the invention is applied.

FIG. 18 is a block diagram showing the entirety of one embodiment of a DDR SDRAM (Double Data Rate Synchronous Dynamic Random Access Memory), to which the invention is applied. The DDR SDRAM of this embodiment is provided with four memory arrays 200A to 200D corresponding to four memory banks, although the invention is not especially limited thereto. The memory arrays 200A to 200D, individually corresponding to the four memory banks 0 to 3, are provided with dynamic memory cells which are arranged in the form of a matrix. According to the Figure, the select terminals of the memory cells, which are arranged on a common column, are coupled to the (not-shown) word lines for each column, and the data input/output terminals of the memory cells, which are arranged on a common row, are coupled to the (not-shown) complementary data lines for each row.

One of the not-shown word lines of the memory array 200A is driven to the select level in accordance with the decoded result of the row address signal by the row decoder (Row DEC) 201A. The not-shown complementary data lines of the memory array 200A are coupled to the I/O lines of a sense amplifier (Sense AMP) 202A and a column select circuit (Column DEC) 203A. The sense amplifier 202A is an amplifier for detecting and amplifying a minute potential difference, which is caused to appear on the individual complementary data lines by reading the data from the memory cells. The column select circuit 203A includes a switch circuit for selecting the complementary data lines individually to connect them with the complementary I/O lines. The column switch circuit is selectively activated according to the decoded result of the column address signal by the column decoder 203A.

The memory arrays 200B to 200D are also provided with row decoders 201B to 201D, sense amplifiers 202B to 202D and column select circuits 203B to 2Q3D. The complementary I/O lines are shared among the individual memory banks and are connected with the output terminal of a data input circuit (Din Buffer) 210 having the write buffer and the input terminal of a data output circuit (Dout Buffer) 211 having the main amplifier. A terminal DQ is a data input/output terminal for inputting/outputting data D0 to D15 of 16 bits, although the invention is not especially limited thereto. A DQS buffer (DQS Buffer) 215 forms a data strobe signal for the data outputted from the terminal DQ.

Address signals A0 to A14, fed from the address input terminal, are first latched in an address buffer (Address Buffer) 204. Of the address signals inputted in time series, the row address signal is latched in a row address buffer (Row Address Buffer) 205. The column address signal is latched in a column address buffer (Column Address Buffer) 206. A refresh counter (Refresh Counter) 208 generates a row address at the automatic refresh (Automatic Refresh) and self refresh (Self Refresh) times.

In the case of a storage capacity of 256 Mbits, for example: the construction of ×4 bits is made effective up to the column address signal A11; the construction of ×8 bits is made effective up to the address signal A10; and the construction of ×16 bits is made effective up to the address signal A9. In the case of a storage capacity of 64 Mbits: the construction of ×4 bits is made effective up to the address signal A10; the construction of ×8 bits is made effective up to the address signal A9; and the construction of ×16 bits, as shown, is made effective up to the address signal A8.

The output of the column address buffer 206 is fed to a column pre-decoder (Column Pre-Decoder) 203, and is pre-decoded separately for the high-order addresses and the low-order addresses, as described hereinbefore, and the pre-decoded output of the low-order addresses is fed as the preset data of a column address counter (Column Counter) 207. This column address counter 207 includes an output buffer circuit, as described hereinbefore, and outputs the pre-decoded signal or its shift signal as the preset data to the column decoders 203A to 203D in accordance with the burst mode or the like designated by a command.

A mode register (Mode Register) 213 latches a variety of action mode information. Only such one of the row decoders (Row Decoders) 201A to 201D as corresponds to the bank designated by a bank select circuit 212 acts to select the word lines. A control circuit (Control Logic) 209 is fed with external control signals such as the clock signals CLK and /CLK (of which the slashed signal means a row enable signal), a clock enable signal CKE, a chip select signal ICS, a column address strobe signal /CAS, a row address strobe signal /RAS or a write enable signal /WE, signals /DM and DQS, and the address signal through the mode register 213, to form internal timing signals for controlling the action mode of the DDR SDRAM and the action of the aforementioned circuit block on the basis of the changes in the levels and the timings of those signals. Thus, the control circuit 209 is provided with input buffers corresponding to those signals.

The clock signals CLK and /CLK are inputted via the clock buffer to a DLL circuit 214 so that the internal clocks synchronized by the clock signals CLK and /CLK are generated. These internal clocks are used as the input signals to the data output circuit 211 and the DQS buffer 215, although the invention is not especially limited thereto. On the other hand, the clock signals supplied through the clock buffer are fed to the clock terminals of the data input circuit 210 and the column address counter 207.

The remaining external input signals are made significant in synchronism with the rising edges of the internal clock signals. The chip select signal /CS instructs the start of the command input cycle with its low level. Neither the high level (or the chip unselect state) of the chip select signal /CS nor the remaining inputs are significant. However, the internal actions such as the select state or the burst action of the later-described memory bank are not influenced by the change to the chip unselect state. The individual signals /RAS, /CAS or /WE are functionally different from the corresponding signals in the ordinary DRAM and are made significant when the later-described command cycles are defined.

The clock enable signal CKE is a signal for indicating the validity of a next clock signal such that the rising edge of the next clock signal CLK is valid, if the signal CKE is at the high level, but invalid if it is at the low level. Where an external control signal /OE for the output enabling control of the data output circuit 211 is produced in the reading mode, the signal /OE is also fed to the control circuit 209 so that the data output circuit 211 is brought into the high output impedance state, for example, if it is at the high level.

The row-address signal is defined by the levels of the address signals A0 to A11 in the later-described row address strobe/bank active command cycle, as synchronized with the rising edge of the clock signal CLK (or the internal clock signal).

The address signals A13 and A14 can be deemed as the bank select signals in the row address strobe/bank active command cycle. Specifically, one of the four memory banks 0 to 3 is selected by the combination of A13 and A14. The selective control of the memory banks can be performed by activating only the row decoder on the selected memory bank side, by not selecting all the clutch switch circuits on the unselect memory bank side, and by making connections with the data input circuit 210 and the data output circuit only on the select memory bank side, although the invention is not especially limited thereto.

In the case of a construction of 256 Mbits and ×16 bits, as described hereinbefore, the column address signal is defined with the levels of the signals A0 to A8 in the read or write command (or the column address/read command or the column address/write command) cycle synchronized with the rising edge of the clock signal CLK (or the internal clock). Moreover, the column address thus defined is used as the start address of the burst access.

Next, the main action mode of the SDRAM, which is instructed by the command, will be described.

(1) Mode Register Set Command (Mo)

This is a command for setting the mode register 213 and is designated with the low level of ICS, /RAS, /CAS and /WE. The data (or the register set data) to be set are given through the signals A0 to A9. The register set data are exemplified by the burst length, the CAS latency, the write mode and so on, although the invention is not especially limited thereto. The burst length to be set is 2, 4 and 8; the CAS latency to be set is 2 and 2.5; and the write mode to be set is the burst write or the single write, although the invention is not especially limited thereto.

The CAS latency indicates what cycles of the internal clock signals are to be consumed in the reading action instructed by the later-described column address/read command, from the fall of the signal /CAS to the outputting action of the output buffer 211. Before the read data are fixed, the internal action time for reading the data is needed and set according to the frequency of the internal clock signals. In other words, where internal clock signals of high frequency are used, the CAS latency is set to a relatively large value. Where internal clock signals of low frequency are used, the CAS latency is set to a relatively small value.

(2) Row Address Strobe/Bank Active Command (Ac)

This is a command for validating the instruction of the row address strobe and the selection of the memory banks with the signals A13 and A14 and is instructed by the low level of the signals /CS and /RAS and the high level of the signals /CAS and /WE. The addresses to be fed to the A0 to A12 are fetched as the row address signals, and the signals to be fed to the A13 and A14 are fetched as the select signals of the memory banks. These fetching actions are made in synchronism with the rising edges of the internal clock signals, as described hereinbefore. When the command is designated, for example, the word line in the memory bank designated is selected so that the memory cells connected with that word line are connected with the individual corresponding complementary data lines.

(3) Column Address/Read Command (Re)

This is a command necessary for starting the burst reading action and instructs the column address strobe. This command is instructed by the low level of the signals /CS and /CAS and the high level of the signals /RAS and /WE so that the column address to be fed to the A0 to A8 (in the case of the construction of ×16 bits) is fetched as the column address signal. The column address signal thus fetched is fed as the burst start address through the column pre-decoder 203' to the column address counter 207.

In the burst reading action thus instructed, the memory banks and the word lines are selected beforehand in the row address strobe/bank active command cycle, so that the memory cells of the word line selected are sequentially selected and continuously read out in response to the pre-decoded signals, which are outputted by the shift action from the column address counter 207 in synchronism with the internal clock signals. The data thus continuously read out has a number which is designated by the burst length 2, 4 or 8. On the other hand, the data read from the output buffer 211 is started awaiting the cycle number of the internal clock signals, as specified by the CAS latency.

(4) Column Address/Write Command (wr)

This command is instructed by the low level of the signals ICS, /CAS and /WE and the high level of the signal /RAS so that the address to be fed to the 0 to A8 is fetched as the column address signal. In he burst write, the column address signal thus fetched is fed to the column address counter 207 through the writing pre-decoders which are contained in the write register and the pre-decoder 2031. The procedure of the burst writing action by thus instruction is similar to that of the burst reading action.

(5) Precharge Command (Pr)

This is a command for starting the precharging action of the memory banks selected with the signals A12 and A13 and is instructed by the low level of the signals /CS, /RAS and /WE and the high level of the signal /CAS.

(6) Auto-Refresh Command

This is a command necessary for starting the auto refresh and is instructed by the low level of the signals /CS, /RAS and /CAS and the high level of the signals /WE and CKE.

(7) No Operation Command (Nop)

This is a command for instructing no substantial operation and is instructed by the low level of the signal /CS and the high level of the signals /RAS, /CAS and /WE.

In the DDR SDRAM, while the burst action is being performed on one memory bank, another memory bank is designated. When the row address strobe/bank active command is fed, the action of the row address line in that other memory bank can be made without influencing the action in that one active memory bank.

So long as the data D0 to D15 do not collide at the data input/output terminals of 16 bits, for example, the command being executed before it is ended issues the precharge command and the row address strobe/bank active command to the memory bank which is different from the memory bank to be processed, so that the internal actions can be started in advance. The DDR SDRAM of this embodiment is given in its entirety a memory capacity of about 256 Mbits (i.e., 4 M×4 banks ×16 bits), because it performs a memory access in a unit of 16 bits, because the row addresses are composed of A0 to A12 (of about 8 K) whereas the column addresses are composed of A0 to A8 (of about 0.5 K) so that the addresses are about 4 M, and because the DDR SDRAM has four memory banks as a whole.

The detailed reading actions of the DDR SDRAM will be described in the following. The individual signals of the chip selecting ICS, /RAS and /CAS signals and the write enable signal /WE are inputted in synchronism with the CLK signal. Simultaneously with the signal /RAS=0, the row address and the bank select signal are inputted to and latched by the row address buffer 205 and the bank select circuit 212, respectively. The row decoder 210 of the bank, as designated by the bank select circuit 212, decodes the row address signal so that the data of the entire row are outputted as minute signals from the memory cell arrays 200. The minute signals thus outputted are amplified and latched by the sense amplifiers 202. The bank thus designated turns active (Active).

After the 3 CLKs from the row address input, the column address and the bank selecting signal are inputted simultaneously with CAS=0 an are retained in the column address buffer 206 and the bank select circuit 212, respectively. If the designated bank is active, the latched column address is outputted from the column address counter 207, and the column decoders 203 select the columns. The selected data are outputted from the sense amplifiers 202. The data outputted at this time are two sets (i.e., 8 bits for the construction of ×4 bits and 32 bits for the construction of ×16 bits).

The data outputted from the sense amplifiers 202 are outputted from the data output circuit 211 to the outside of the chip. The output timing is synchronized with the two rising and falling edges of a QCLK outputted from the DLL 214. At this time, the two sets of data are subjected to parallel→serial conversions into data of 1 set×2. Simultaneously with the data output, the data strobe signal DQS is outputted from the DQS buffer 215. Where the burst length stored in the mode register 213 is 4 or longer, the column address counter 207 shifts the address automatically to read the data of a next column.

The role of the DLL 214 is to generate the action clock QCLK of the data output circuit 211 and the DQS buffer 215.

The data output circuit 211 and DQS buffer 215 are supplied with the internal clock signal QCLK generated in the DLL 214, so that it takes a long time to output the data signal and the data strobe signal actually. By advancing the phase of the internal clock signal QCLK earlier than the external CLK by using a replica circuit, therefore, the phases of the data signal and the data strobe signal are made coincident with the external clock CLK. In this case, therefore, what is made coincident in phase with the external clock signal is the data signal and the data strobe signal.

Figure 19:
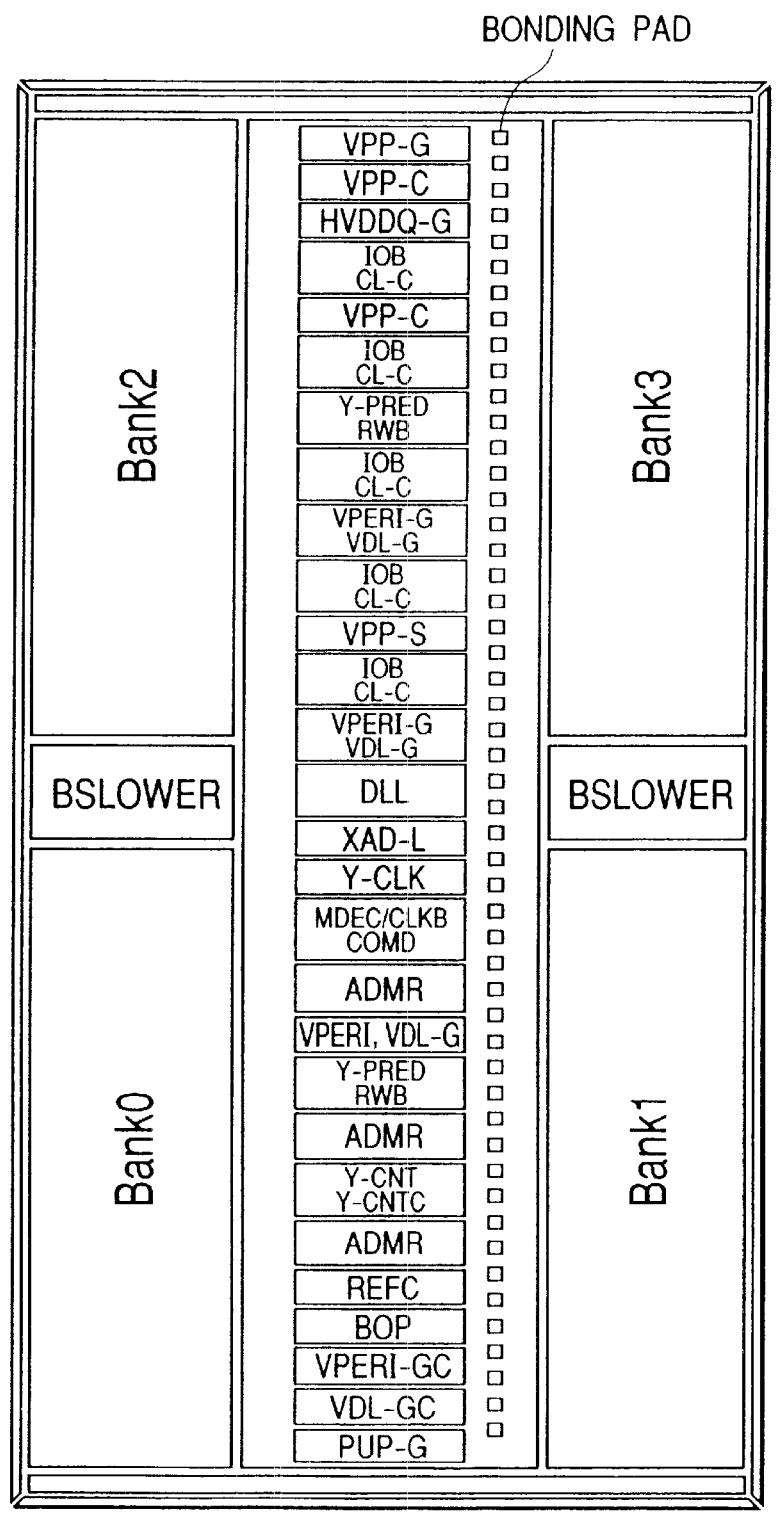
FIG. 19 is a schematic layout diagram showing one embodiment of an SDRAM, to which the invention is applied.

FIG. 19 is a schematic layout diagram showing one embodiment of an SDRAM, to which the invention is applied. The individual circuit blocks of the same Figure are formed over one semiconductor substrate of single crystalline silicon by the well-known semiconductor integrated circuit manufacturing technique. The individual circuits are drawn to conform substantially to the geometrical layout over the semiconductor substrate. In this embodiment, the memory array is entirely divided as previously described into four memory banks (Banks) 0 to 3.

The memory banks 0 to 3 correspond to such a memory array wherein they are divided into upper and lower banks and transverse banks in the longitudinal direction of the semiconductor chip. At the central portion along the longitudinal direction of the chip, there is arranged a peripheral circuit which is composed of an address input circuit, a data input/output circuit and a column of bonding pads. In this peripheral circuit, there are juxtaposed the random/logic circuit and the bonding pads so as to rationalize the layout of the aforementioned individual circuits which form the random/logic circuit.

In this embodiment, the peripheral circuit and the bonding pad column are juxtaposed to each other. In this construction, the bonding pad column is arranged at a position offset from the center line along the longitudinal direction of the semiconductor chip. As a result, the central portion along the longitudinal direction of the semiconductor chip can retain a relatively large bulky area so that the layout of the circuit elements can be conveniently designed. Even the construction, in which the peripheral circuit and the bonding pad column are juxtaposed as in this embodiment, is better suited for high integration and high speed than the case in which the peripheral circuits are transversely shared and arranged around the bonding pads.

This embodiment is directed to the aforementioned synchronous DRAM, and the peripheral circuit includes the following individual circuit blocks. At the central portion of the upper half, as seen along the longitudinal direction of the semiconductor chip in this Figure, there are arranged the following individual circuit blocks. Letters VPP-G designate a boosted voltage generator which is used in the action voltage of a select circuit for the word lines having the memory cells connected therewith or a select circuit for the later-described shared switch MOSFET, to determine the select level. Letters VPP-C designate a control circuit for controlling the action of the booster circuit.

Letters HVDDQ-G form a voltage divided into one half from a power voltage VDD. This voltage is used as a reference voltage for the input buffer made of a differential circuit thereby to determine the high/low levels of the-input signal of the VDD amplitude. Letters IOB and CL-C designate an input/output circuit and a clock control circuit, the latter of which is used for the action control corresponding to the CAS latency of the output buffer. Five similar circuits IOB and CL-C are provided in the entirety of the circuit.

Letters Y-PRED and RWB designate a Y-pre-decoder and a read/write buffer. Of these, the read/write buffer controls the action of the main amplifier and acts as the write amplifier. Letters VPERI-G and VDL-G designate drop voltage generators for forming a dropped action voltage VPREI of the peripheral circuit and an action voltage VDL of the sense amplifier. There are additionally provided two similar drop voltage generators. Letters VPP-S designate a VPP sensor for detecting whether or not the VPP voltage is a desired one. At the central portion of the semiconductor chip, moreover, there is provided the DLL (Delay Locked Loop) for forming an internal clock signal corresponding to the clock signal fed from the external terminal.

At the central portion of the lower half along the longitudinal direction of the semiconductor chip of the same Figure, there are provided the following individual circuit blocks. Letters XAD-L designate an X-address latch circuit and letters Y-CLK designate a Y-clock circuit for generating a clock signal corresponding to the action of the Y line. Letters MDEC/CLKB and COMD designate a mode decoder/clock buffer and a command circuit. Letters ADMR designate an address mode register, and a similar one is provided at another position. Letters Y-CNT and Y-CNC designate a Y-counter and its control circuit; letters REFC designate a refresh control circuit; letters BOP designate a bonding option circuit; and letters PUP-G designate a power-ON detector.

In this embodiment, another peripheral circuit BSLOWER is provided at the central portion of the shorter direction of the semiconductor chip, although the invention is not especially limited thereto. This circuit BSLOWER is provided with a defect relieving circuit including a fuse set and an address comparator for replacing the faulty word line of the memory array (or the memory bank) by a preparatory word line or the faulty bit line by a preparatory bit line, although the invention is not especially limited thereto.

Figure 20:
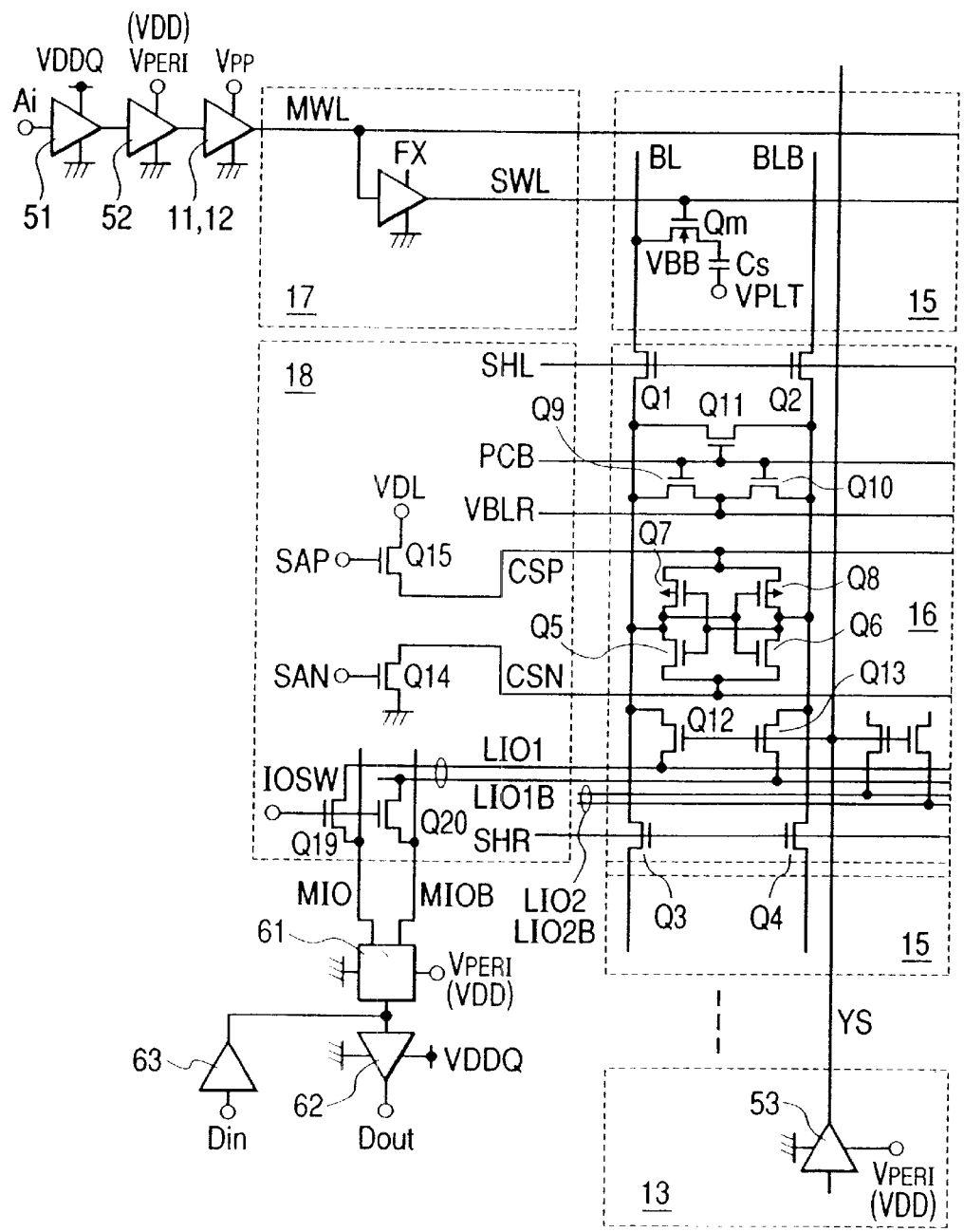
FIG. 20 is a circuit diagram showing one embodiment of a dynamic RAM, to which the invention is applied.

FIG. 20 is a circuit diagram showing one embodiment in which the circuit is simplified from the address input to the data output while centering the sense amplifier portion of the dynamic RAM, to which the invention is applied. This embodiment is directed to a divisional word line system or a hierarchical word line system. In the Figure, there are exemplified the circuits which are provided in a sense amplifier (i.e., SA of FIG. 5) 16 sandwiched between two upper and lower memory mats 15 and in an intersection area (i.e., SAD and IOSW of FIG. 5) 18, but the remaining circuits are shown in blocks. On the other hand, the circuit symbols attached to the circuit elements of the Figure are partially overlapped with those of FIG. 4, but it should be understood that the circuit symbols have other circuit functions.

The dynamic memory cells are represented by one which is interposed between a sub word line SWL in one of the memory mats 15 and one bit line BL of the complementary bit lines BL and BLB. The dynamic memory cell is composed of an address selecting MOSFET Qm and a storage capacitor Cs. The gate of the address selecting MOSFET Qm is connected with the sub word line SWL. The drain of this MOSFET Qm is connected with the bit line BL. The storage capacitor Cs is connected with the source of the MOSFET Qm.

The other electrode of the storage capacitor Cs is shared and provided with a plate electrode VPLT. A negative back bias voltage VBB is applied to the substrate (or channel) of the MOSFET Qm. The back bias voltage VBB is set to a voltage of −1 V, although the invention is not especially limited thereto. The select level of the sub word line SWL is set to such a high voltage VPP as is raised from the high level of the bit lines by the threshold voltage of the address select MOSFET Qm.

Where the sense amplifier 16 is caused to act at an internal drop voltage VDL, the high level, as amplified by the sense amplifier 16 and fed to the bit lines, is set to the internal voltage level VDL. Therefore, the high voltage VPP corresponding to the select level of the word lines is set to VDL+Vth+α. The paired complementary bit lines BL and BLB of the memory mat, which are disposed over the sense amplifier 16, are arranged in parallel, as shown in the Figure. These complementary bit lines BL and BLB are connected with the input/output nodes of the unit circuit of the sense amplifier by the shared switch MOSFETs Q1 and Q2.

The unit circuit of the sense amplifier 16 is constructed of a CMOS latch circuit which is composed of N-channel type amplifier MOSFETs Q5 and Q6 and P-channel type amplifier MOSFETs Q7 and Q8, having gates and drains crossly connected into a latch shape. The sources of the N-channel type MOSFETs Q5 and Q6 are connected with a common source line CSN. The sources of the P-channel type MOSFETs Q7 and Q8 are connected with a common source line CSP. To these common source lines CSN and CSP, individually, there are connected power switch MOSFETS.

The common source line CSN, which is connected with the sources of the N-channel type amplify MOSFETs Q5 and Q6, is fed with an action voltage corresponding to the earth potential by an N-channel type power switch MOSFET Q14 which is disposed in the aforementioned cross area (SAD) 18, although the invention is not especially limited thereto. Likewise, the common source line CSP, which is connected with the sources of the P-channel type amplify MOSFETs Q7,and Q8, is provided with an N-channel type power MOSFET Q15 for feeding the internal voltage VDL. The power switch MOSFET may be disposed in the sense amplify region 16 by dispersing it to the individual unit circuits.

Sense amplifier activating signals SAN and SAP to be fed to the gates of the N-channel type power MOSFETs Q14 and Q15 are in the same phase to be set to the high level when the sense amplifier is activated. The high level of the signal SAP is the signal at the level of the high voltage VPP. This high voltage VPP is set to about 3.6 V for the VDL at 1.8 V so that it can turn ON the N-channel type MOSFET Q15 sufficiently to set the common source line CSP to the internal voltage level VDL The unit circuit of the sense amplifier 16 is provided at its input/output nodes with a precharge (or equalize) circuit which is composed of the equalize MOSFET Q11 for short-circuiting the complementary bit lines and switch MOSFETs Q9 and Q10 for feeding a half precharge voltage VBLR to the complementary bit lines. The gates of these MOSFETs Q9 to Q11 are commonly fed with a precharge signal PCB. The driver circuit for forming the precharge signal PCB is provided with an inverter circuit, although not shown at the cross area 18 to speed up its rise or fall. At the time of starting the memory access and prior to the word line selecting timing, the MOSFETs Q9 to Q11 composing the precharge circuit are switched at a high speed through the inverter circuits which are dispersed in the individual cross area 18.

In the cross area (IOSW) 18, there are switch MOSFETs Q19 and Q20 which form the IOSW switch. In addition to the circuits shown in the Figure, there are provided, if necessary, a half precharge circuit for the common source lines CSP and CSN of the sense amplifier 16, a half precharge circuit for a local input/output lines LIO, a VDL precharge circuit for the main input/output lines, and a disperse driver circuit for shared select signal lines SHR and SHL.

The unit circuit of the sense amplifier 16 is connected through the shared switch MOSFETs Q3 and Q4 with similar complementary bit lines BL and BLB of the memory mat 15, located on the lower side. When the sub word line SWL of the upper memory mat is selected, for example, the upper shared switch MOSFETs Q1 and Q2 of the sense amplifier are turned ON, but the lower shared switch MOSFETs Q3 and Q4 are turned OFF. Switch MOSFETs Q12 and Q13 form a column select circuit, which is turned ON when the select signal YS is given a select level (or a high level), to connect the input/output nodes of the unit circuit of the sense amplifier with local input/output lines LI01 and LI01B (or LI02 and LI02B).

The sense amplifier 16 and the cross area 18 are provided with two pairs of local input/output lines such as LI01 and LI01B, and LI02 and LI02B, so that the two pairs of complementary bit lines of the memory mat 15 are connected by the single select signal YS with the two pairs of local input/output lines LI01 and LI01B, and LI02 and LI02B. The other not-shown sense amplifier 16 across the memory mat 15 is also provided with two pairs of local input/output lines so that the four pairs of complementary bit lines in the memory mat are connected with the four pairs of local input/output lines.

When the upper shared switch MOSFETs Q1 and Q2 are ON, the sense amplifier is connected at its input/output nodes with the upper complementary bit lines BL and BLB, to amplify the minute signal coming from the memory cell connected with the selected sub word line SWL thereby to transmit the amplified signal through the column select circuit (i.e., Q12 and Q13) to the local input/output lines LI01 and LI01B. The local input/output lines LI01 and LI01B are extended transversely of the Figure along the sense amplifier column. The local input/output lines LI01 and LI01B are connected through a select circuit (IOSW), which is disposed in the cross area 18 and is composed of the N-channel type MOSFETs Q19 and Q20, with main input/output lines MIO and MIOB which are connected with the input terminal of the main amplifier 61.

The select circuit IOSW forming the IO switch circuit is switched with a mat select signal MS which is formed by decoding the X-address signal. Here, the select circuit IOSW may be a CMOS switch in which the P-channel MOSFETs are individually connected in parallel with the N-channel type MOSFETs Q19 and Q20. In the burst mode of the synchronous DRAM, the column-select signal Ys is switched by the counter action to switch the connections of the local input/output lines LI01 and LI01B, and LI02 and LI02B, as exemplified, and the two pairs of complementary bit lines BL and BLB of the memory mat.

An address signal Ai is fed to an address buffer 51. This address buffer acts in a time sharing manner to fetch the X-address signal and the Y-address signal. The X-address signal is fed to a pre-decoder 52 to form a select signal of a main word line MWL through a main row decoder 11 and a main word driver 12. The address buffer 51 receives the address signal Ai, which is fed from the external terminal, and is activated by a power voltage VDDQ fed from the external terminal.

The pre-decoder is activated by a dropped voltage VPERI (VDD), and the main word driver 12 is activated by the boosted voltage VPP. As this main word driver 12, a logic circuit is used which has a level converting function which receives the pre-decoded signal. A column decoder (or driver) 53 receives the Y-address signal which is fed by the time-sharing action of the address buffer 51, to form the select signal YS.

The main amplifier 61 is activated by the dropped voltage VPERI (VDD) to output the power voltage VDDQ fed from the external terminal through an output buffer 62 to an external terminal Dout. A write signal, inputted from an external terminal Din, is fetched through an input buffer 63 so that the write signal is fed to the main input/output lines MIO and MIOB through the write amplifier (or the write driver) contained in the main amplifier 61, as shown in the Figure. The output buffer 62 is provided at its input portion with a level converting circuit and a logic portion for outputting the output signal in synchronism with a timing signal corresponding to the clock signal.

The power voltage VDDQ, fed from the external terminal, is set to 3.3 V in the first mode; the dropped voltage VPERI (VDD), fed to the internal circuit, is set to 2.5 V; and the action voltage VDL of the sense amplifier is set to 1.8 V, although the invention is not especially limited thereto. Moreover, the select signal (or the boosted voltage) of the word lines is set to 3.6 V. The precharge voltage VBLR of the bit lines is set to 0.9 V, corresponding to VDL/2, and the plate voltage VPLT is also set to 0.9 V. Moreover, the substrate voltage VBB is set to −1.0 V. The power voltage VDDQ, fed from the external terminal, is set to as low as 2.5 V in the second mode. With this low power voltage VDDQ, the dropped voltage VPERI (VDD) and the dropped voltage VDL may be set to an equal value of about 1.8 V.

Alternatively, the power voltage VDDQ, fed from the external terminal, may be set to 3.3 V, and the dropped voltage VPERI (VDD), fed to the internal circuit and the action voltage VDL of the sense amplifier may be equally set to 2.0 V or 1.8 V. Thus, the internal voltage can take various modes for the external power voltage VDDQ.

In the description thus far made, it should be understood that the terminology "MOS" is intrinsically a simplified name for metal/oxide/semiconductor. However, the general name "MOS" of recent years refers to a device in which either the essential portion of a metal in the semiconductor device is replaced by a non-metal electric conductor, such as poly-silicon, or an oxide in the device is replaced by another insulator. The terminology "CMOS" has been understood to have a wide technical meaning according to the change in the aforementioned broad meaning of the MOS. The terminology "MOSFET" should not be understood to have a narrow meaning, but includes a construction as wide as the insulated gate field effect transistor. The terminologies "CMOS" and "MOSFET" follow the general names.

The effects to be obtained from the foregoing embodiments will be enumerated in the following.

(1) A Semiconductor memory device comprises: a memory array including a plurality of word lines and a plurality of bit lines; and a column address decoder for selecting a predetermined bit line from the plurality of bit lines. The column address decoder includes: first and second pre-decoders corresponding to high-order and low-order addresses, respectively; a shift register for using the output signal of the second pre-decoder as an initial value; and an output circuit for selecting either the output signal of the second pre-decoder or the output signal of the shift register in accordance with an action mode. The select signal is formed by the output signal of the first pre-decoder and the output signal through the output circuit. The shift register includes a first shift register for an even address and a second shift register for an odd address and forms a plurality of sets of continuous select signals of the bit lines by its shifting action. Thus, there is obtained an effect to improve the continuous select function.

(2) A semiconductor memory device comprises: a memory array including a plurality of word lines and a plurality of bit lines; and a column address decoder for selecting a predetermined bit line from the plurality of bit lines. The column address decoder includes: first and second pre-decoders corresponding to high-order and low-order addresses, respectively; a shift register for using the output signal of the second pre-decoder as an initial value; and an output circuit for selecting either the output signal of the second pre-decoder or the output signal of the shift register in accordance with an action mode. The select signal is formed by the output signal of the first pre-decoder and the output signal through the output circuit. The shift register includes a first shift register for an even address and a second shift register for an odd address. Thus, there is obtained an effect to speed up the continuous selecting actions of the bit lines, as composed of a sequential action and an interleave action, on the basis of the initial value by combining its up and down shifting actions.

(3) In addition, the semiconductor memory device is applied to a synchronous dynamic RAM, and the sequential action and the interleave action are designated with the logic 0 and the logic 1 of the signals of predetermined bits of an address bus. Thus, there is obtained an effect that a conveniently usable semiconductor memory device can be provided.

(4) In addition, the burst length is designated to be 2, 4 and 8 by another bit of the address bus. Thus, there is obtained an effect that a conveniently usable semiconductor memory device can be provided.

(5) In addition, the first and second pre-decoders include writing: first and second pre-decoders and reading first and second pre-decoders. The semiconductor memory device further comprises a write address register for delaying the address signal, as inputted through the address buffer, by the shifting action of a clock signal. The address signal, as delayed by the write address signal, is fed to the inputs of the writing first and second pre-decoders to make a column selecting action in accordance with a row selecting action. Thus, there is obtained an effect that it is possible to realize the write and read actions corresponding to the speed-up of the clock signal.

(6) A semiconductor memory device comprises: a memory array including a plurality of word lines, a plurality of bit lines and a redundant bit line; and a column address decoder for selecting a predetermined bit line from the plurality of bit lines. The column address decoder includes: first and second pre-decoders corresponding to high-order and low-order addresses, respectively; a shift register using the output signal of the second pre-decoder as an initial value; and an output circuit for selecting either the output signal of the second pre-decoder or the output signal of the shift register in accordance with an action mode. A redundant circuit for switching to the redundant bit line includes: a comparator for comparing that one of the faulty addresses stored in the memory circuit which corresponds to the high-order address and the address signal inputted; a redundant pre-decoder for decoding the low-order address of the faulty addresses; and a coincidence detect circuit for detecting the compared coincidence output of the comparator and a coincidence between the individual outputs of the redundant pre-decoder and the second pre-decoder. A predetermined bit line is selected from the redundant bit lines by the redundant bit line select circuit in response to the detected signal of the coincidence detect signal in place of the select signal formed in the column address decoder. Thus, there is obtained an effect that it is possible to speed up the action and to enhance the relief efficiency while using less redundant bit lines.

(7) In addition, the shift register includes a first shift register for an even address and a second shift register for an odd address and forms two sets of continuous select signals of the bit lines, as composed of a sequential action and an interleave action, on the basis of the initial value by combining its up and down shifting actions, and the second pre-decoder forms initial values corresponding individually to the even address first shift register and the odd address second shift register. Thus, there is obtained an effect that the sequential action and the interleave action can be realized while speeding up the actions.

(8) In addition, the semiconductor memory device is applied to a synchronous dynamic RAM, and the sequential action and the interleave action are designated with the logic 0 and the logic 1 of the signals of predetermined bits of an address bus. Thus, there is obtained an effect that it is possible to provide a conveniently usable semiconductor memory device.

(9) In addition, the burst length is designated to contain 2, 4 and 8 by another bit of the address bus. Thus, there is obtained an effect that it is possible to provide a conveniently usable semiconductor memory device.

(10) In addition, the first and second pre-decoders include writing first and second pre-decoders and reading first and second pre-decoders. The semiconductor memory device further comprises a write address register for delaying the address signal, as inputted through the address buffer, by the shifting action of a clock signal. The address signal, as delayed by the write address signal, is fed to the inputs of the writing first and second pre-decoders to perform a column selecting action in accordance with a row selecting action. Thus, there is obtained an effect that the writing and reading actions can be realized to cope with the speed-up of the clock signal.

Although our invention has been specifically described in connection with various embodiments, it should not be limited thereto, but could naturally be modified in various manners without departing from the gist thereof. For example, the order of the continuous addresses by the shifting action of the column address counter (or the shift register) may be not only the sequential or interleave action but also effected by subtracting −1 sequentially on the basis of the initial value, by only the even addresses, by only the odd addresses, or by the odd addresses after all the even addresses are selected, or vice versa.

The semiconductor memory device can be likewise applied not only to the aforementioned synchronous DRAM but also to a static RAM, to the column selecting action of a nonvolatile memory device such as a flash memory or to the above-specified one including a redundant circuit. The invention can be widely utilized in a semiconductor memory device to be mounted on a system LSI or in a variety of general-purpose semiconductor memory devices.

The effects to be obtained by the representative aspects of the invention, as disclosed herein, will be briefly described in the following. Specifically, a semiconductor memory device comprises: a memory array including a plurality of word lines and a plurality of bit lines; and a column address decoder for selecting a predetermined bit line from the plurality of bit lines. The column address decoder includes: first and second pre-decoders corresponding to high-order and low-order addresses, respectively; a shift register for using the output signal of the second pre-decoder as an initial value; and an output circuit for selecting either the output signal of the second pre-decoder or the output signal of the shift register in accordance with an action mode. The select signal is formed by the output signal of the first pre-decoder and the output signal through the output circuit. The shift register includes a first shift register for an even address and a second shift register for an odd address. Thus, it is possible to speed up the continuous selecting actions of the bit lines, as composed of a sequential action and an interleave action, on the basis of the initial value by combining its up and down shifting actions.

A semiconductor memory device comprises: a memory array including a plurality of word lines, a plurality of bit lines and a redundant bit line; and a column address decoder for selecting a predetermined bit line from the plurality of bit lines. The column address decoder includes: first and second pre-decoders corresponding to high-order and low-order addresses, respectively; a shift register for using the output signal of the second pre-decoder as an initial value; and an output circuit for selecting either the output signal of the second pre-decoder or the output signal of the shift register in accordance with an action mode. A redundant circuit for switching to the redundant bit line includes: a comparator for comparing that one of the faulty addresses stored in the memory circuit which corresponds to the high-order address and the address signal inputted; a redundant pre-decoder for decoding the low-order address of the faulty addresses; and a coincidence detect circuit for detecting the compared coincidence output of the comparator and a coincidence between the individual outputs of the redundant pre-decoder and the second pre-decoder. A predetermined bit line is selected from the redundant bit lines by the redundant bit line select circuit in response to the detected signal of the coincidence detect signal in place of the select signal formed in the column address decoder. Thus, it is possible to speed up the action and to enhance the relief efficiency while using less redundant bit lines.

What is claimed is:

1. A semiconductor memory comprising:
   a plurality of bit lines;
   a plurality of word lines;
   a plurality of memory cells;
   a row address decoder;
   a column address decoder including a pre-decoder and a shift register which uses an output signal of said pre-decoder as an initial value thereof; and
   a selector which selects one or more of said plurality of bit lines on the basis of output signals of said shift register,
   wherein said shift register forms a first continuous select signal corresponding to a sequential action and a second continuous select signal corresponding to an interleave action.

2. A synchronous dynamic memory comprising:
   a plurality of bit lines;
   a plurality of word lines;
   a plurality of memory cells;
   a row address decoder;
   a column address decoder including a pre-decoder and a shift register which receives an output signal of said pre-decoder;
   a selector which selects one or more of said plurality of bit lines on the basis of output signals of said shift register; and
   a mode register;
   wherein said shift register forms a first continuous select signal corresponding to a sequential action and a second continuous select signal corresponding to an interleave action, and
   wherein one of said sequential action and said interleave action is designated by said mode register.

3. A double data rate synchronous dynamic memory comprising:
   a plurality of bit lines;
   a plurality of word lines;
   a plurality of memory cells;
   a row address decoder;
   a column address decoder including a pre-decoder and a circuit which receives an output signal of said pre-decoder;
   a selector which selects one or more of said plurality of bit lines on the basis of output signals of said shift register;
   a mode register; and
   an address register which stores an address signal used for a write operation;
   wherein said circuit forms a first continuous select signal corresponding to a sequential action and a second continuous select signal corresponding to an interleave action,
   wherein one of said sequential action and said interleave action is designated by said mode register, and
   wherein said address signal, delayed by said address register, is supplied to said pre-decoder.

* * * * *